US011614875B2

(12) United States Patent
Keeth et al.

(10) Patent No.: US 11,614,875 B2
(45) Date of Patent: *Mar. 28, 2023

(54) RECONFIGURABLE MEMORY ARCHITECTURES

(71) Applicant: Micron Technology, Inc., Boise, ID (US)

(72) Inventors: Brent Keeth, Boise, ID (US); James Brian Johnson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/142,837

(22) Filed: Jan. 6, 2021

(65) Prior Publication Data

US 2021/0124512 A1 Apr. 29, 2021

Related U.S. Application Data

(63) Continuation of application No. 15/981,708, filed on May 16, 2018, now Pat. No. 10,936,221.

(Continued)

(51) Int. Cl.
*G11C 7/10* (2006.01)
*G06F 3/06* (2006.01)
(Continued)

(52) U.S. Cl.
CPC .......... *G06F 3/0632* (2013.01); *G06F 3/0604* (2013.01); *G06F 3/0673* (2013.01);
(Continued)

(58) Field of Classification Search
CPC .................................................. G06F 3/0632
See application file for complete search history.

(56) References Cited

U.S. PATENT DOCUMENTS

| 6,034,900 A | 3/2000 | Shirley et al. |
| 6,185,654 B1 | 2/2001 | Van |

(Continued)

FOREIGN PATENT DOCUMENTS

| CN | 102084430 A | 6/2011 |
| CN | 102341860 A | 2/2012 |

(Continued)

OTHER PUBLICATIONS

JESD235A, JEDEC Standard High Bandwidth Memory DRAM, Nov. 2015, JEDEC, pp. 1-172.

(Continued)

*Primary Examiner* — Min Huang
(74) *Attorney, Agent, or Firm* — Holland & Hart, LLP

(57) ABSTRACT

Techniques are described herein for a reconfigurable memory device that is configurable based on the type of interposer used to couple the memory device with a host device. The reconfigurable memory device may include a plurality components for a plurality of configurations. Various components of the reconfigurable memory die may be activated/deactivated based on what type of interposer is used in the memory device. For example, if a first type of interposer is used (e.g., a high-density interposer), the data channel may be eight data pins wide. In contrast, if second type of interposer is used (e.g., an organic-based interposer), the data channel may be four data pins wide. As such, a reconfigurable memory device may include data pins and related drivers that are inactive in some configurations.

20 Claims, 20 Drawing Sheets

Related U.S. Application Data

(60) Provisional application No. 62/576,520, filed on Oct. 24, 2017.

(51) Int. Cl.

| | | |
|---|---|---|
| *H01L 23/538* | (2006.01) | |
| *H01L 25/18* | (2023.01) | |
| *G11C 11/4076* | (2006.01) | |
| *G11C 11/4093* | (2006.01) | |
| *G11C 11/4096* | (2006.01) | |
| *G11C 11/22* | (2006.01) | |
| *G06F 11/10* | (2006.01) | |
| *H01L 25/065* | (2023.01) | |
| *H01L 23/50* | (2006.01) | |
| *G11C 5/02* | (2006.01) | |
| *G11C 11/00* | (2006.01) | |
| *H01L 23/14* | (2006.01) | |
| *G11C 11/4097* | (2006.01) | |

(52) U.S. Cl.
CPC ...... *G06F 11/1004* (2013.01); *G06F 11/1048* (2013.01); *G11C 5/025* (2013.01); *G11C 11/005* (2013.01); *G11C 11/221* (2013.01); *G11C 11/2293* (2013.01); *G11C 11/4076* (2013.01); *G11C 11/4093* (2013.01); *G11C 11/4096* (2013.01); *H01L 23/50* (2013.01); *H01L 23/5386* (2013.01); *H01L 25/0657* (2013.01); *H01L 25/18* (2013.01); *G11C 7/1045* (2013.01); *G11C 11/4097* (2013.01); *H01L 23/145* (2013.01); *H01L 23/147* (2013.01); *H01L 23/5384* (2013.01); *H01L 2225/0652* (2013.01); *H01L 2225/06517* (2013.01); *H01L 2225/06541* (2013.01); *H01L 2225/06565* (2013.01)

(56) References Cited

U.S. PATENT DOCUMENTS

| | | |
|---|---|---|
| 7,827,336 B2 | 11/2010 | Miller et al. |
| 8,233,303 B2 | 7/2012 | Best et al. |
| 8,254,191 B2 | 8/2012 | Jeddeloh et al. |
| 8,386,722 B1 | 2/2013 | Wang et al. |
| 8,797,779 B2 | 8/2014 | Rajan et al. |
| 8,885,380 B2 | 11/2014 | Kang et al. |
| 8,922,243 B2 | 12/2014 | Jayasena et al. |
| 9,065,722 B2 | 6/2015 | Thottethodi et al. |
| 9,135,185 B2 | 9/2015 | Loh et al. |
| 9,136,842 B2 | 9/2015 | Rahman et al. |
| 9,158,619 B2 | 10/2015 | Kobla et al. |
| 9,170,948 B2 | 10/2015 | Loh et al. |
| 9,171,585 B2 | 10/2015 | Rajan et al. |
| 9,251,873 B1 | 2/2016 | Fox et al. |
| 9,298,395 B2 | 3/2016 | Coteus et al. |
| 9,406,403 B2 | 8/2016 | Loh et al. |
| 9,570,147 B2 | 2/2017 | Kim |
| 9,697,147 B2 | 7/2017 | Loh et al. |
| 9,767,028 B2 | 9/2017 | Cheng et al. |
| 9,995,785 B2 | 6/2018 | Pappu et al. |
| 10,079,044 B2 | 9/2018 | Jayasena et al. |
| 10,152,244 B2 | 12/2018 | Roberts |
| 10,180,906 B2 | 1/2019 | Stocksdale et al. |
| 10,282,309 B2 | 5/2019 | Jayasena et al. |
| 10,410,694 B1 | 9/2019 | Arbel et al. |
| 10,579,578 B2* | 3/2020 | Johnson .............. G06F 13/4243 |
| 10,936,221 B2* | 3/2021 | Keeth ....................... H01L 23/50 |
| 2002/0015342 A1* | 2/2002 | Kuge ...................... G11C 29/50 |
| | | 365/201 |
| 2003/0214344 A1* | 11/2003 | Suwa ....................... G11C 8/10 |
| | | 327/530 |
| 2006/0235577 A1* | 10/2006 | Ikeda ....................... G11C 5/02 |
| | | 701/1 |
| 2008/0320268 A1 | 12/2008 | Wingard et al. |
| 2009/0292798 A1 | 11/2009 | Basham et al. |
| 2010/0265909 A1 | 10/2010 | Petite et al. |
| 2013/0073755 A1 | 3/2013 | Sadowski et al. |
| 2013/0167251 A1 | 6/2013 | Pio |
| 2013/0173846 A1 | 7/2013 | Lassa et al. |
| 2013/0214432 A1 | 8/2013 | Wu et al. |
| 2014/0040698 A1 | 2/2014 | Loh et al. |
| 2014/0115281 A1 | 4/2014 | Coteus et al. |
| 2014/0175665 A1 | 6/2014 | Kang |
| 2014/0176187 A1 | 6/2014 | Jayasena et al. |
| 2014/0181458 A1 | 6/2014 | Loh et al. |
| 2014/0204690 A1 | 7/2014 | Jeddeloh |
| 2014/0298119 A1 | 10/2014 | Laberge et al. |
| 2015/0046612 A1 | 2/2015 | Gupta |
| 2015/0199126 A1 | 7/2015 | Jayasena et al. |
| 2015/0255434 A1 | 9/2015 | Yazdani |
| 2015/0262628 A1 | 9/2015 | Pio |
| 2015/0357047 A1 | 12/2015 | Tiwari |
| 2016/0027482 A1* | 1/2016 | DeLaCruz .......... H01L 23/5381 |
| | | 365/219 |
| 2016/0141419 A1 | 5/2016 | Baenninger et al. |
| 2016/0163609 A1 | 6/2016 | Rahman et al. |
| 2016/0306584 A1 | 10/2016 | Zawodny et al. |
| 2016/0328156 A1 | 11/2016 | Swarbrick et al. |
| 2017/0068769 A1 | 3/2017 | Singh et al. |
| 2017/0133103 A1* | 5/2017 | Kwon ...................... G11C 7/10 |
| 2017/0251513 A1 | 8/2017 | Engelien-lopes et al. |
| 2017/0255552 A1 | 9/2017 | Chatterjee et al. |
| 2018/0032437 A1 | 2/2018 | Stocksdale et al. |
| 2018/0082756 A1 | 3/2018 | Tiwari |
| 2018/0184435 A1 | 6/2018 | Cariou et al. |
| 2018/0358058 A1 | 12/2018 | Manning |
| 2019/0121775 A1 | 4/2019 | Johnson et al. |
| 2019/0287584 A1 | 9/2019 | Hollis |
| 2020/0145350 A1 | 5/2020 | Treue et al. |

FOREIGN PATENT DOCUMENTS

| | | |
|---|---|---|
| CN | 102543154 A | 7/2012 |
| CN | 105493188 A | 4/2016 |
| CN | 106489179 A | 3/2017 |
| WO | 2015/013043 A1 | 1/2015 |

OTHER PUBLICATIONS

Chinese Patent Office, "Office Action and Search Report", issued in connection with Chinese Patent Application No. 201811011108.5 dated Oct. 26, 2022 (8 pages). (Foreign language).

Chinese Patent Office, "Office Action and Search Report", issued in connection with Chinese Patent Application No. 201811013708.5 dated Nov. 28, 2022 (30 pages) Original Document Only.

Guoqiang, H. et al., A Design of Multi-channel Memory Architecture with Address Interleaving for High Performance Computing, Modern Radar, vol. 39 Issue 8, Aug. 15, 2017, pp. 37-43. (English Abstract only).

* cited by examiner

RECONFIGURABLE MEMORY ARCHITECTURES

CROSS REFERENCE

The present application for patent is a continuation of U.S. patent application Ser. No. 15/981,708 by Keeth et al., entitled "Reconfigurable Memory Architectures," filed May 16, 2018, which claims the benefit of and priority to U.S. Provisional Patent Application No. 62/576,520 by Keeth et al., entitled "Reconfigurable Memory Architectures," filed Oct. 24, 2017, assigned to the assignee hereof, and each of which is expressly incorporated by reference in its entirety herein.

BACKGROUND

The following relates generally to devices and methods for reconfigurable memory architectures.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. FeRAM may use similar device architectures as volatile memory but may have non-volatile properties due to the use of a ferroelectric capacitor as a storage device. FeRAM devices may thus have improved performance compared to other non-volatile and volatile memory devices.

Improving memory devices, generally, may include increasing memory cell density, increasing read/write speeds, increasing reliability, increasing data retention, reducing power consumption, or reducing manufacturing costs, among other metrics. Advancing memory technology has realized improvements for many of these metrics, but high reliability, low latency, and/or low-power devices tend to be expensive and unscalable. As the applications for high reliability, low latency, low-power memory increases, so too does the need for scalable, efficient, and cost-effective devices for such applications.

DETAILED DESCRIPTION

When manufacturing memory devices it may be advantageous to build a single memory die and/or a single memory stack that is compatible with multiple types of interposers. In this manner, as technology advancements occur and as memory needs change, the same memory die may be utilized for changing memory configurations, including changing interposer configurations.

Techniques described herein relate to a reconfigurable memory device that is configurable based on the type of interposer used to couple the memory device with a host device. The reconfigurable memory device may include a plurality components for different configurations. Various components of the reconfigurable memory die may be activated/deactivated based on a type of interposer used in the memory device. For example, if a first type of interposer is used (e.g., a silicon interposer), the data channel may be eight data pins wide. In contrast, if second type of interposer is used (e.g., an organic-based interposer), the data channel may be four data pins wide. As such, a reconfigurable memory device may include data pins and related drivers that are inactive in some configurations, among other changes.

Features of the disclosure introduced above are further described below in the context of FIG. 1. Specific examples are then described for FIGS. 2-17. These and other features of the disclosure are further illustrated by and described with reference to apparatus diagrams, system diagrams, and flowcharts that relate to devices and methods for reconfigurable memory architectures.

Figure 1:
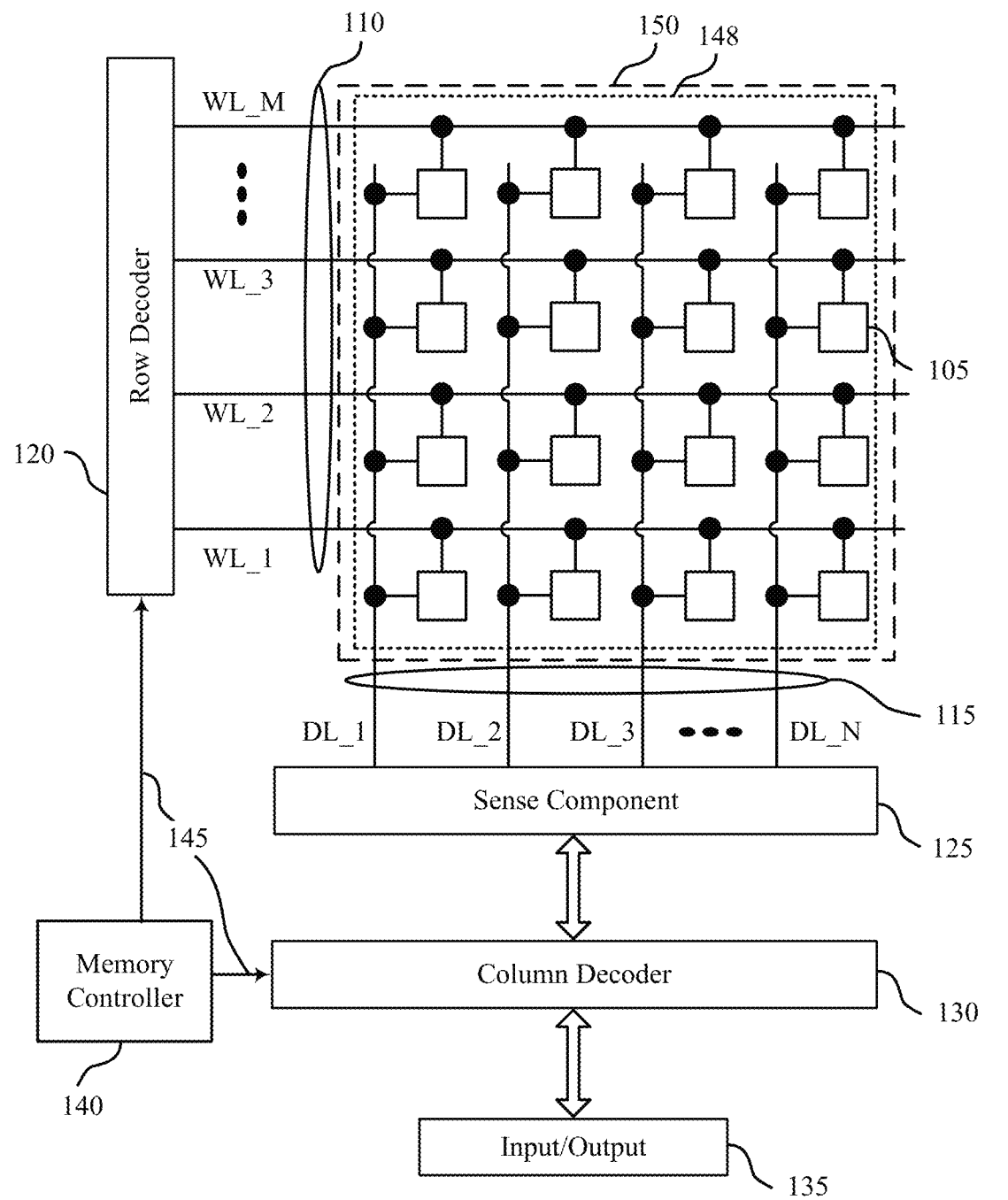
FIG. 1 illustrates an example of a memory die that supports devices and methods for reconfigurable memory architectures in accordance with examples of the present disclosure.

FIG. 1 illustrates an example memory die 100 in accordance with various aspects of the present disclosure. Memory die 100 may also be referred to as an electronic memory apparatus, a memory array, an array of memory cells, or a deck of memory cells, in some examples. Memory array 148 includes memory cells 105 that are programmable to store different states. Memory cells 105 may be arranged in one or more banks of memory cells that may be independently accessible. Each memory cell 105 may be programmable to store two states, denoted as a logic 0 and a logic 1. In some cases, memory cell 105 is configured to store more than two logic states.

A memory cell 105 may store a charge representative of the programmable states in a capacitor; for example, a charged and uncharged capacitor may represent two logic states, respectively. DRAM architectures may use such a design, and the capacitor employed may include a dielectric material with linear or para-electric electric polarization properties as the insulator. FeRAM architectures may also employ such a design.

Operations such as reading and writing may be performed on memory cells 105 by activating access line 110 and digit line 115. Access lines 110 may also be known as word lines 110, and bit lines 115 may also be known digit lines 115. References to word lines and bit lines, or their analogues, are interchangeable without loss of understanding or operation. Activating a word line 110 or a digit line 115 may include applying a voltage to the respective line. Word lines 110 and digit lines 115 may be made of conductive materials such as metals (e.g., copper (Cu), aluminum (Al), gold (Au), tungsten (W), etc.), metal alloys, carbon, conductively-doped semiconductors, or other conductive materials, alloys, compounds, or the like.

According to the example of FIG. 1, each row of memory cells 105 is connected to a single word line 110, and each column of memory cells 105 is connected to a single digit line 115. By activating one word line 110 and one digit line 115 (e.g., applying a voltage to the word line 110 or digit line 115), a single memory cell 105 may be accessed at their intersection. Accessing the memory cell 105 may include reading or writing the memory cell 105. The intersection of a word line 110 and digit line 115 may be referred to as an address of a memory cell. Additionally or alternatively, for example, each row of memory cells 105 may be arranged in one or more banks of memory cells.

In some architectures, the logic storing device of a cell, e.g., a capacitor, may be electrically isolated from the digit line by a selection component (not shown). The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate digit line 115. Row decoder 120 and column decoder 130 may receive a row address and a column address, respectively, for a memory cell located within one specific bank of memory cells. Additionally or alternatively, each bank of memory cells may be in electronic communication with a separate row decoder 120 and column decoder 130. For example, memory die 100 may include multiple word lines 110, labeled WL_1 through WL_M, and multiple digit lines 115, labeled DL_1 through DL N, where M and N depend on the array size. Thus, by activating a word line 110 and a digit line 115, e.g., WL_2 and DL_3, the memory cell 105 at their intersection may be accessed.

Upon accessing a memory cell 105, the cell may be read, or sensed, by sense component 125 to determine the stored state of the memory cell 105. For example, after accessing the memory cell 105, the capacitor of memory cell 105 may discharge onto its corresponding digit line 115. Discharging the capacitor may result from biasing, or applying a voltage, to the capacitor. The discharging may cause a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic 1 and vice versa. Sense component 125 may include various transistors or amplifiers in order to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120.

A memory cell 105 may be set, or written, by similarly activating the relevant word line 110 and digit line 115—i.e., a logic value may be stored in the memory cell 105. Column decoder 130 or row decoder 120 may accept data, for example input/output 135, to be written to the memory cells 105. A memory cell 105 may be written by applying a voltage across the capacitor. This process is discussed in more detail below.

The memory controller 140 may control the operation (e.g., read, write, re-write, refresh, discharge, etc.) of memory cells 105 through the various components, for example, row decoder 120, column decoder 130, and sense component 125. Memory controller 140 may be a component of memory die 100 or may be external to memory die 100 in various examples. In some cases, one or more of the row decoder 120, column decoder 130, and sense component 125 may be co-located with the memory controller 140. Memory controller 140 may generate row and column address signals in order to activate the desired word line 110 and digit line 115. The memory controller 140 may activate the desired word line 110 and digit line 115 of a specific bank of memory cells via at least one channel traversing the array 148. Memory controller 140 may also generate and control various voltages or currents used during the operation of memory die 100. For example, it may apply discharge voltages to a word line 110 or digit line 115 after accessing one or more memory cells 105. Memory controller 140 may be coupled to memory cells 105 via channels 145. Channels 145 are illustrated in FIG. 1 as logical connections with row decoder 120 and column decoder 130, but those skilled in the art will recognize that other configurations may be employed. As described herein, memory controller 140 may exchange data (e.g., from a read or write operation) with cells 105 multiple times per clock cycle.

Memory die 100 may include memory array 148, which may overlie a CMOS area, such as CMOS under array (CuA) 150. Memory array 148 may include memory cells 105 that are connected to word lines 110 and digit lines 115. The CuA 150 may underlie the memory array 148 and include support circuitry. CuA 150 may underlie the row decoder 120, sense component 125, column decoder 130, and/or memory controller 140. Or CuA 150 may include one or more of row decoder 120, sense component 125, column decoder 130, and memory controller 140. The support circuitry may support one or more additional arrays of memory cells present in a stacked configuration. In a stacked configuration, CuA 150 may facilitate accessing one or more memory cells in each array. For example, CuA 150 may facilitate the transfer of data between a memory cell coupled to a channel of memory array 148, a memory cell coupled to a channel of an additional array that is coupled to memory array 148, and the controller.

In general, the amplitude, shape, or duration of an applied voltage or current discussed herein may be adjusted or varied and may be different for the various operations discussed in operating the memory die 100. Furthermore, one, multiple, or all memory cells 105 within memory die 100 may be accessed simultaneously; for example, multiple or all cells of memory die 100 may be accessed simultaneously during a reset operation in which all memory cells 105, or a group of memory cells 105, are set to a single logic state.

Figure 2:
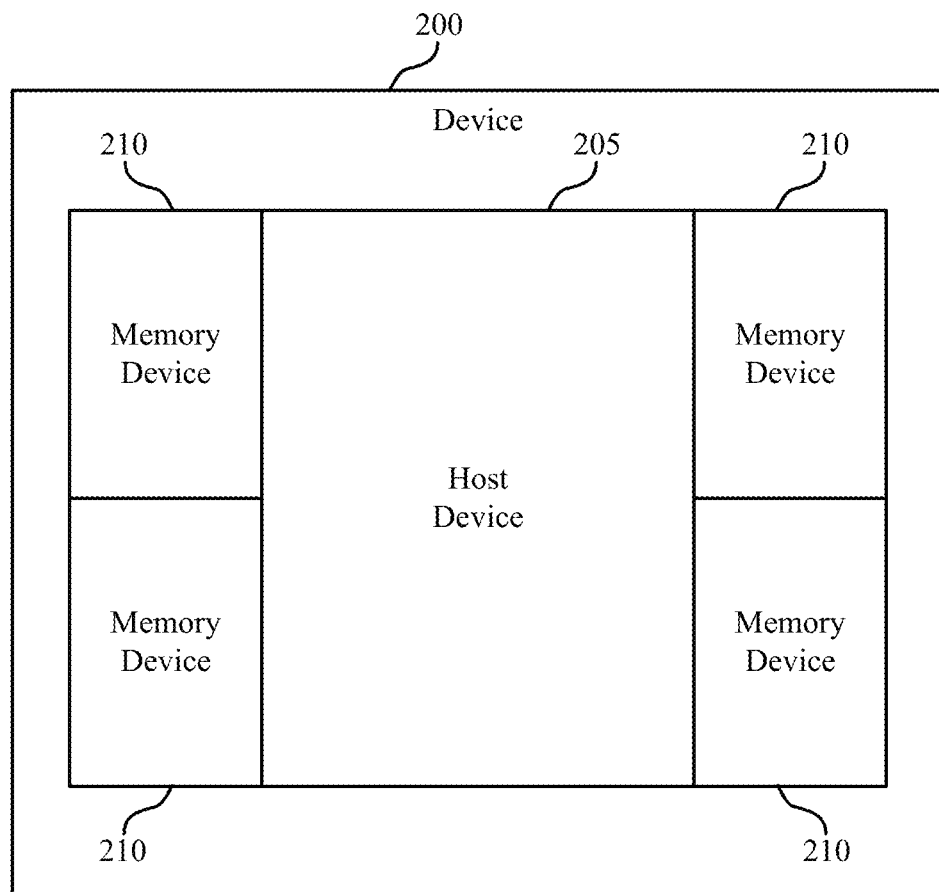
FIG. 2 illustrates an example of a device that supports devices and methods for reconfigurable memory architectures in accordance with examples of the present disclosure.

FIG. 2 illustrates an example of a device 200 that supports devices and methods for reconfigurable memory architectures in accordance with various examples of the present disclosure. The device 200 may include a host device 205 and a plurality of memory devices 210. The plurality of memory device 210 may be examples a finer grain memory device (e.g., finer grain DRAM or finer grain FeRAM).

The host device 205 may be an example of a processor (e.g., a central processing unit (CPU), a graphics processing unit (GPU)) or a system on a chip (SoC). In some cases, the host device 205 may be separate component from the memory device such that the host device 205 may be manufactured separately from the memory device. In some cases, the host device 205 may be external to the memory device 210 (e.g., a laptop, server, personal computing device, smartphone, personal computer). In the device 200, the memory devices 210 may be configured to store data for the host device 205. The host device 205 may exchange information with the memory devices 210 using signals communicated over signal paths. In some cases, the signal paths at least partially include an interposer (silicon or organic).

In some situations, the device 200 may perform better using a high-speed connection between the host device 205 and the memory devices 210. As such, some memory devices 210 support applications, processes, host devices, or processors that have multiple terabytes per second (TB/s) bandwidth needs. Satisfying such a bandwidth constraint within an acceptable energy budget poses challenges.

The memory devices 210 may be configured such that the signal path between the memory cells in the memory devices 210 and the host device 205 are as short as possible. For example, the memory devices 210 may be bufferless memory devices. In another example, the data channels coupling a memory device 210 with the host device 205 may be configured to be shorter than previous designs.

In some cases, an interposer may be used to couple the memory devices 210 with the host device 205. Depending on the constraints of the host device 205 (e.g., bandwidth constraints), various different types of interposers may be used (e.g., silicon interposers or organic interposers). The memory dies of the memory devices 210 may be configured to work with multiple types of interposers. As such, the memory dies of the memory devices 210 may be reconfigurable based on a type of the interposer used to couple the host device 205 with the memory devices 210.

Figure 3:
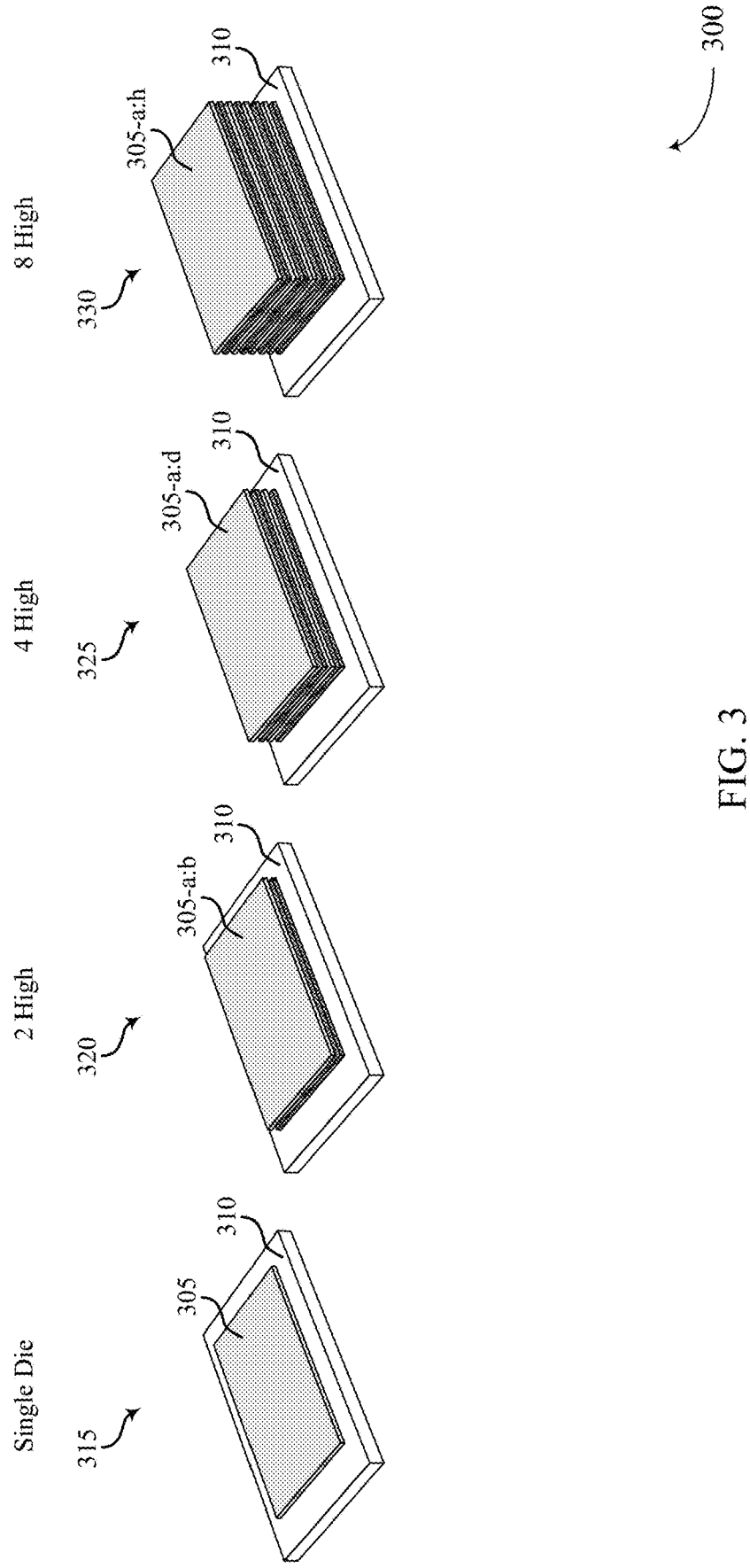
FIG. 3 illustrates an example of a device that supports devices and methods for reconfigurable memory architectures in accordance with examples of the present disclosure.

FIG. 3 illustrates an example of a device 300 that supports devices and methods for reconfigurable memory architectures in accordance with various examples of the present disclosure. The memory devices 300 include at least one memory die 305 and a communication medium 310. The communication medium 310 may, in some cases, be an example of a substrate and/or an interposer.

The memory die 305 may include a plurality of memory cells (as shown in and described with reference to FIG. 1) that may be programmable to store different logic states. For example, each memory cell may be programmed to store one or more logic states (e.g., a logic '0', a logic '1', a logic '00', a logic '01', a logic '10', a logic '11'). The memory cells of the memory dies 305 may use a variety of different storage technologies to store data including DRAM, FeRAM, phase change memory (PCM), 3D XPoint™ memory, NAND memory, NOR memory, or a combination thereof. In some cases, a single memory device may include a first memory die that uses a first memory technology (e.g., DRAM) and a second memory die that uses second memory technology (e.g., FeRAM) different from the first memory technology.

In some cases, the memory dies 305 may be an example of two-dimensional (2D) array of memory cells. In some cases, multiple memory dies 305 may be stacked on top of one another to form a three-dimensional (3D) array. In some examples, a memory die may include multiple decks of memory cells stacked on top of one another. Such a configuration may increase the quantity of memory cells that may be formed on a single die or substrate as compared with 2D arrays. In turn, this may reduce production costs, or increase the performance of the memory array, or both. Each level of the array may be positioned so that memory cells across each level may be approximately aligned with one another, forming a memory cell stack. In some cases, the memory dies 305 may be stacked directly on one another. In other cases, one or more of the memory dies 305 may be positioned away from a stack of memory dies (e.g., in different memory stacks).

For example, a first memory device 315 may be an example of a single die package that includes a single memory die 305 and a communication medium 310. A second memory device 320 may be an example of a two-high device that includes two memory dies 305-*a:b* and an communication medium 310. A third memory device 325 may be an example of a four-high device that includes four memory dies 305-*a:d* and an communication medium 310. A fourth memory device 330 may be an example of an eight-high device that includes eight memory dies 305-*a:h* and an communication medium 310. A memory device 300 may include any quantity of memory dies 305 stacked on top of a common interposer (e.g., a common substrate). The dies are shown as different shadings to more clearly demonstrate the different layers. In some cases, the memory dies in different layers may be configured similarly as adjacent dies in the memory device.

The memory dies 305 may include one or more vias (e.g., through-silicon vias (TSVs)). In some cases, the one or more vias may be part of internal signal paths that couple controllers with memory cells. The vias may be used to communicate between memory dies 305, for example, when the memory dies 100 are stacked on one another. In some cases, some vias may be used to facilitate communication between a controller of the memory device and at least some of the memory dies 305. In some cases, a single via may be coupled with multiple memory dies 305.

The communication medium 310 may be any structure or medium used to couple the memory dies 305 with a host device such that signals may be exchanged between the memory dies 305 and the host device. The communication medium 310 may be a substrate, an organic substrate, a high-density interposer, a silicon interposer, or a combination thereof used to couple the memory dies 305 with a host device. The communication medium 310 may be positioned above, below, or to the side of a memory array. The communication medium 310 may not be limited to being underneath other components but may be in any configuration relative to the memory array and/or other components. In some instances, the communication medium 310 may be referred to as a substrate, however, such references are not limiting.

The communication medium 310 may be formed of a different types of materials. In some cases, the communication medium 310 may be an example of one or more organic substrates. For example, the communication medium 310 may include a package substrate (e.g., an organic substrate) coupled with at least one if not both of the host device and the stack of memory dies 305. In another example, the communication medium 310 may include an organic substrate of the memory device and the package substrate. A substrate may be an example of a printed circuit board that mechanically supports and/or electrically connects components. The substrate may use conductive tracks, pads and other features etched from one or more layers of a conductive material (e.g., copper) laminated onto and/or between layers of a non-conductive material. Components may be fastened (e.g., soldered) onto the substrate to both electrically connect and mechanically fasten the components. In some cases, non-conductive materials of a substrate may be formed of a variety of different materials including phenolic paper or phenolic cotton paper impregnated with resin, fiberglass impregnated with resin, metal core board, polyimide foil, Kapton, UPILEX, polyimide-fluoropolymer composite foil, Ajinomoto build-up film (ABF), or other materials, or a combination thereof.

In some cases, the communication medium 310 may be a high-density interposer such as a silicon interposer. A high-density interposer may be configured to provide wide communication lanes between connected components (e.g., a memory device and a host device). The high-density interposer may include a plurality of high-resistance channels for communicating between devices. The channels may be completely independent of one another in some cases. Some channels may be unidirectional and some channels may be bidirectional.

The high-density interposer may provide wide communication lanes by offering a high quantity of channels to connect components. In some cases, the channels may be thin traces of connecter (e.g., copper), thereby making each individual channel lossy. Because each channel may be highly resistive, as the frequency of data transferred increases, the power needed to transfer the data goes up in a non-linear relationship with the frequency. Such characteristics may impose a practical frequency ceiling that can be used to transmit data given an amount of transmit power over a channel of the high-density interposer. To increase the amount of data transferred in a given amount of time, the high-density interposer may include a very high quantity of channels. As such, a bus of the memory device may be wider than other types of interposer (e.g., organic interposers) used in some DRAM architectures, such as DDR4 (double data rate fourth-generation synchronous dynamic random-access memory) or GDDR5 (double data rate type five synchronous graphics random-access memory). The interposer (whether it is silicon or organic) may be formed of a first material (e.g., silicon or organic) that is different from a second material that forms a substrate of the package.

Figure 4:
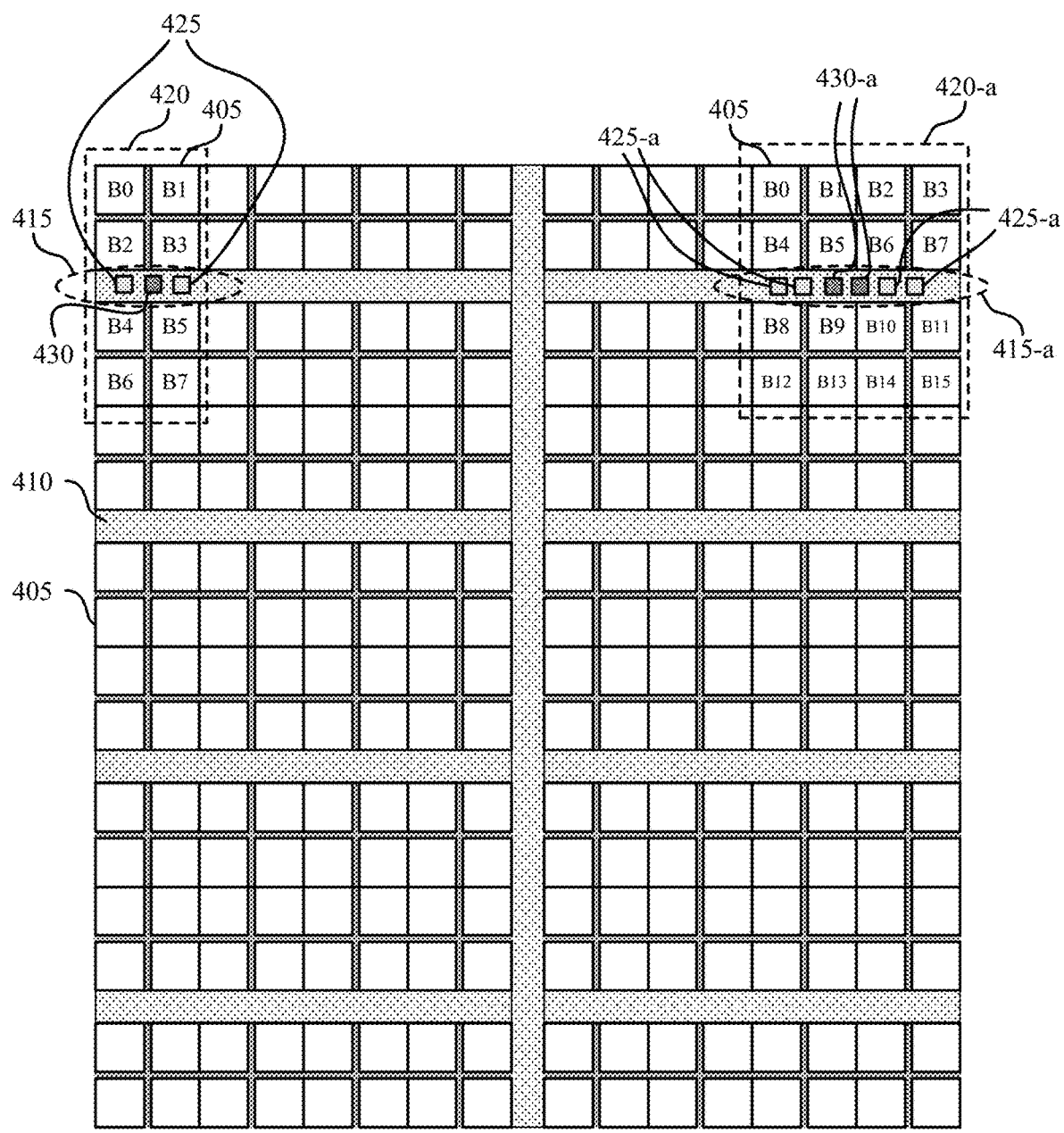
FIG. 4 illustrates an example of a memory die that supports devices and methods for reconfigurable memory architectures in accordance with examples of the present disclosure.

FIG. 4 illustrates an example of a memory die 400 that supports devices and methods for reconfigurable memory architectures in accordance with various examples of the present disclosure. The memory die 400 may be an example of a memory die 305 described with reference to FIG. 3. In some cases, the memory die 400 may be referred to as a memory array, an array of memory cells, or a deck of memory cells. The various components of the memory die 400 may be configured to facilitate high bandwidth data transfer between the host device and a memory device with which the memory die 400 is associated.

The memory die 400 may include a plurality of banks 405 of memory cells (as represented by the white boxes), a plurality of input/output (I/O) areas 410 (sometimes referred to as I/O regions or I/O stripes) traversing the memory cells of the memory die 400, and a plurality of data channels 415 that couple the memory die 400 with the host device. Each of the banks 405 of memory cells include a plurality of memory cells configured to store data. The memory cells may be DRAM memory cells, FeRAM memory cells, or other types of memory cells described herein. The plurality of I/O areas 410 may include a plurality of power pins and ground pins configured to couple the memory cells of the memory die 400 with power and ground.

The memory die 400 may be divided into cell regions 420 associated with different data channels 415. For example, a single data channel 415 may be configured to couple a single cell region 420 to the host device. The pins of the I/O area may be configured to couple multiple cell regions 420 of the memory die 400 to power, ground, virtual ground, and/or other supporting components.

To provide a high throughput of data (e.g., multiple TB/s) between a host device (not shown) and the memory die 400, a path length between any given memory cell and the host interface may be shortened, as compared to previous solutions. In addition, shortening the data path between any given memory cell and the host device may also reduce the power consumed during an access operation (e.g., read operation or write operation) of that given memory cell. Different architectures and/or strategies may be employed to reduce the size of the data path.

In some examples, the memory die 400 may be partitioned into a plurality of cell regions 420. Each cell region 420 may be associated with a data channel 415. Two different types of cell region 420 are illustrated, but the entire memory die 400 may be populated with any quantity of cell regions 420 having any shape. A cell region 420 may include a plurality of banks 405 of memory cells. There may be any quantity of banks 405 in a cell region 420. For example, the memory die 400 illustrates a first cell region 420 that includes eight banks 405 and a second cell region 420-a that includes sixteen banks 405-a. Other quantities of banks in the cell region are possible, however (e.g., two, three, four, five, six, seven, eight, nine, ten, eleven, twelve, thirteen, fourteen, fifteen, sixteen, seventeen, eighteen, nineteen, twenty, twenty-one, twenty-two, twenty-three, twenty-four, twenty-five, twenty-six, twenty-seven, twenty-eight, twenty-nine, thirty, thirty-one, thirty-two, etc.). The size of the cell region 420 may be selected based on the bandwidth constraints of the host device, the power constraints of the host device or the memory device, the size of the data channel, the type of interposer used to couple the memory die 400 with the host device, a data rate associated with the data channel, other considerations, or combinations thereof. In some cases, the memory die 400 may be partitioned such that each cell region 420 is the same size. In other cases, the memory die 400 may be partitioned such that the memory die 400 has cell regions 420 of different sizes.

A data channel 415 (associated with a cell region) may include pins for coupling the memory cells of the cell region 420 with the host device. At least a portion of the data channel 415 may comprise channels of the interposer. The data channel 415 may include a data width specifying how many data pins 425 (sometimes referenced as DQ pins) are in the data channel 415. For example, a data channel may have a channel width of two data pins (e.g., X2 channel), four data pins (e.g., X4 channel), eight data pins (e.g., X8 channel), sixteen data pins (e.g., X16 channel), etc. The data channel may also include at least one command/address (C/A) pin 430. Each memory cell in the cell region 420 may be configured to transfer data to and from the host device using the pins 425, 430 associated with the cell region 420. The data channel 415 may also include a clock pin (e.g., CLK) and/or a register clock pin (RCLK).

In some cases, the I/O area 410 may bisect the banks 405 of memory cells in the cell region 420. In this manner, the data path for any individual memory cell may be shortened. The C/A pin 230 may be configured to communicate command frames between the memory die 400 and the host device.

Figure 5:
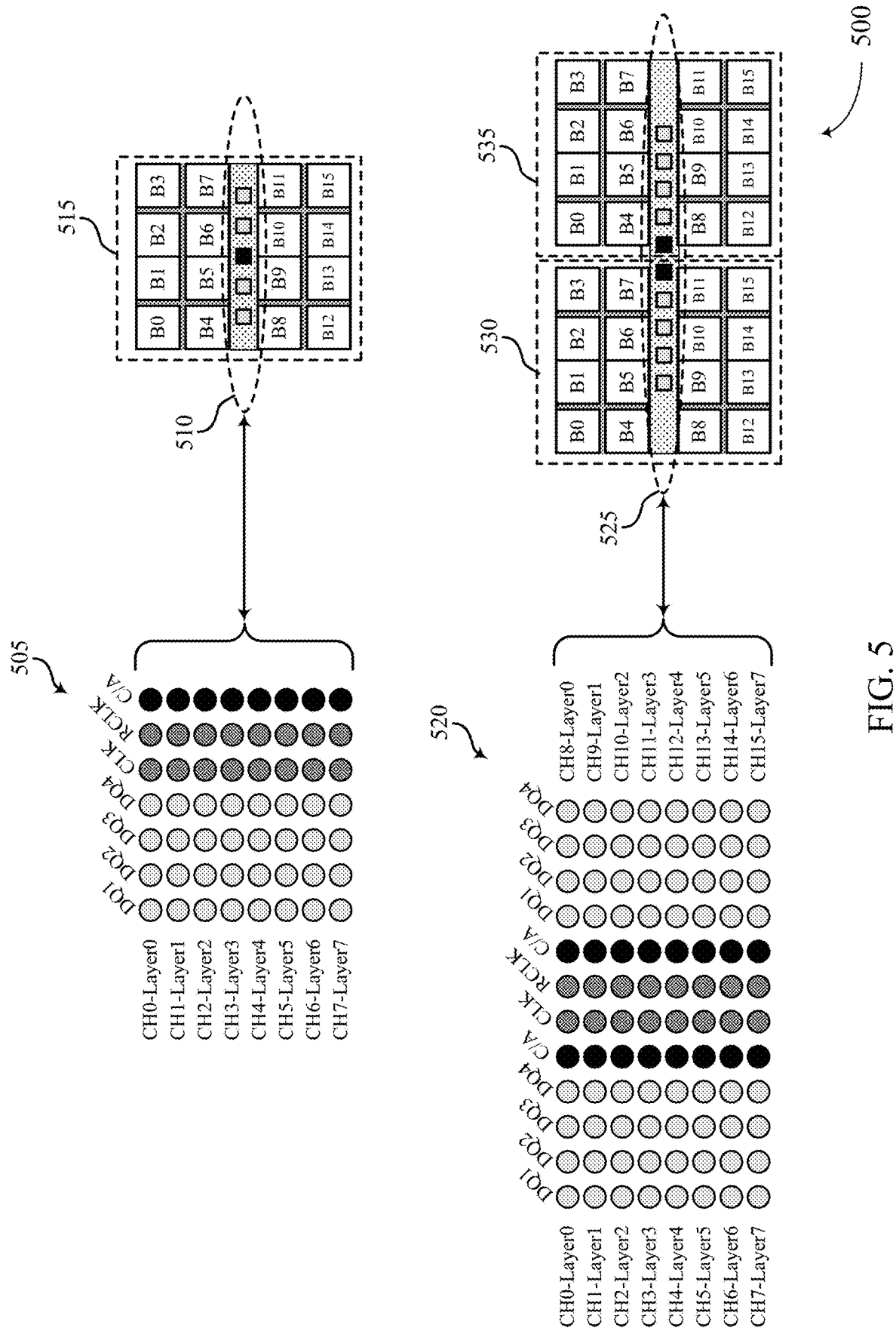
FIG. 5 illustrates an examples of data channels that support devices and methods for reconfigurable memory architectures in accordance with examples of the present disclosure.

FIG. 5 illustrates an example of a data channel configurations 500 that support devices and methods for reconfigurable memory architectures in accordance with various examples of the present disclosure. For example, a first data channel configuration 505 illustrates an independent data channel 510 that services a first cell region 515. A second data channel configuration 520 illustrates a data channel pair 525 where data channels for two cell regions (e.g., second cell region 530 and third cell region 535) share clock pins.

The data channel 510 illustrates a data channel for a stacked memory device that includes eight layers that has a channel width of four (e.g., there are four data pins). Each row of pins in the data channel 510 are associated with a cell region in a separate layer. The first cell region 515 illustrates a cell region of a single layer. As such, the first cell region 515 is associated with a single row of the pins of the data channel 510. The quantity of pins in a data channel may be based on the quantity of layers in the memory device because a single data channel may be configured to couple with multiple layers. In some cases, the term data channel may refer to pins associated with a single cell region of a single layer. In some cases, the term data channel may refer to pins associated with multiple cell regions across multiple layers. In some examples, data channels are coupled with only a single cell region of any given layer or memory die. The same is also true for the data channel pair 525 of the second data channel configuration 520. The data channel pair 525 shows pins for cell regions across multiple layers of the memory device. While data channel 510 and data channel pair 525 shown are associated with cell regions in eight layers, any quantity of layers are possible. For example, the data channel 510 and data channel pair 525 may be associated with cell regions in one, two, three, four, five, six, seven, eight, nine, ten, eleven, twelve, thirteen, fourteen, fifteen, or sixteen layers of the memory device.

The data channel 510 includes four data pins (DQ0-DQ4), a clock pin (CLK), a register clock pin (RCLK), and a command/address pin (CA). In other cases, the data channel may be have a different rank or different channel width. In such situations, the quantity of data pins may be different. For example, the data channel 510 may have a channel width of eight and may include eight data pins. Any quantity of data pins associated with a region are contemplated by this disclosure. The data channel 510 may include any quantity of C/A pins. For example, the data channel 510 may include one, two, three, or four C/A pins. In some cases, the data channel 510 may include an error correction code (ECC) pin (not shown) for facilitating error detection and correction procedures.

The data channel pair 525 is similarly embodied as the data channel 510 except that two data channels associated with two different cell regions are configured to share clock pins. As such, in the data channel pair 525, the clock pins (e.g., CLK and RCLK) are coupled with two cell regions of the same layer of the memory device, while the other pins of the data channel pair 525 (e.g., DQ pins, C/A pins, ECC pins) are coupled with a single cell region of a single layer. For example, the illustrated data channel pair 525 has a width of four. As such, four data pins and one C/A pin (e.g., CH0-Layer0) are coupled with the second cell region 530 and four data pins and one C/A pin (CH8-Layer0) are coupled with the third cell region 535.

The data channel pair 525 may reduce the complexity of a memory device and the power consumption of the memory device. For example, by sending a single set of clock signals to two cell regions in a layer, it may reduce the amount of clock components in the memory device and thereby reduce the amount of power to drive the clock signals.

Figure 6A:
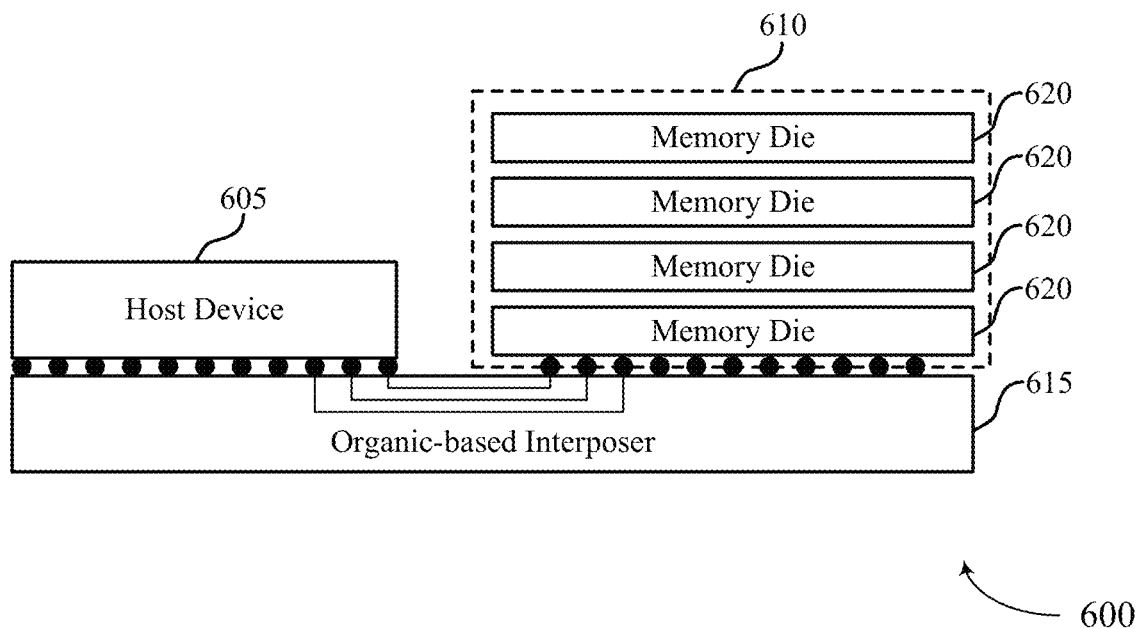
FIGS. 6A and 6B illustrate examples of devices that support devices and methods for reconfigurable memory architectures in accordance with examples of the present disclosure.

FIG. 6A illustrates an example of a device 600 that supports devices and methods for reconfigurable memory architectures in accordance with various examples of the present disclosure. The device 600 may be an example of a device where a host device 605 is coupled with a memory device 610 using an organic-based interposer 615. The device 600 may be an example of the device 200 described with reference to FIG. 2. The host device 605 may be an example of the host device 205 and other host devices described with reference to FIGS. 2-5. The memory device 610 may be an example of the memory devices 210, 300 and portions of memory devices described with reference to FIGS. 2-5. The organic-based interposer 615 may be an example of the interposer described with reference to FIG. 3. The memory device 610 may include one or more memory dies 620. The memory dies 620 may be examples of the memory dies 305, memory die 400 as described with reference to FIGS. 3 and 4. In some cases, the memory dies 620 may be referred to as memory arrays, arrays of memory cells, or decks of memory cells.

Various parameters and characteristics of the memory device 610 may be determined based on performance constraints of the overall device 600. For example, if the host device 605 requests that information be exchanged with the memory device 610 at a specific bandwidth (e.g., four terabytes per second (TB/s)) and the interposer 615 is organic-based, various characteristics of the memory device 610 may be selected based on these constraints. The organic-based interposer 615 may include interposers formed from compounds made of carbon and hydrogen atoms.

The organic-based interposer 615 includes a plurality of channels that couple the memory device 610 with the host device 605. Such channels have particular resistance and that resistance may impact an amount of power it takes to transmit data at a given data rate. As the data rate (e.g., frequency) of the signal communicated using the interposer 615 increases, the amount of needed to transmit also increases in a non-linear relationship. A data rate of the memory device 610 may be based on the type of interposer used to communicate signals. In some cases, data rate of the memory device 610 may also be based on the performance constraints of the host device 605. For example, as the performance constraints of the host device 605 go up, the acceptable threshold for power consumption may also go up.

Other characteristics of the memory device 610 may also be determined based on the performance constraints and/or the type of the interposer. For example, the channel width of the data channel may be determined. In many memory devices, the amount of data channels may be fixed by legacy technology (e.g., the quantity of data channels between the host device 605 and the memory device 610 may be sixteen data channels). As the channel width goes up, the quantity of pins used to communicate payload data, control data, and/or clock signals may be increased. In other examples, the quantity of banks in a cell region, or said another way, the quantity of banks accessed using a single data channel, may be determined based on the performance constraints and/or the type of the interposer. In other examples, the quantity of clock signals used in the memory device may be determined based on the performance constraints and/or the type of the interposer. In addition, various characteristics of the clock signals may be determined based on the performance constraints and/or the type of the interposer. For example, the frequency and phase of the clock signals may be determined based on the performance constraints and/or the type of the interposer. In other examples, the use of an ECC pin may be determined based on the performance constraints and/or the type of the interposer. In other examples, pin drivers may be activated or deactivated, as the case may be, based on the performance constraints and/or the type of the interposer. In other examples, whether the memory device includes data channel pairs may be based on the performance constraints and/or the type of the interposer. In other examples, a modulation scheme (e.g., NRZ or PAM4) for signals communicated over the pins may be determined based on the performance constraints and/or the type of the interposer.

In some examples, the memory device 610 with the organic-based interposer 615 may be configured to meet a fixed performance constraint (e.g., 4 TB/s) of the host device 605. In such examples, the memory device 610 may have a data rate of 16 GB/s, the channel width of the data channel may be four data pins (e.g., X4) with a single C/A pin (e.g., data channel 510 as described with reference to FIG. 5), the quantity of banks of memory cells in a cell region may be sixteen, and the memory device 610 may include a 4-phase clock signal. The 4-phase clock signal may include a first signal at 4 GHz and a phase of zero, a second signal at 4 GHz and a phase of 90 degrees, a third signal at 4 GHz and a phase of 180 degrees, and a fourth signal at 4 GHz and a phase of 270 degrees. In other examples, the frequencies and the phases of the clock signals may be different.

These various parameters of the memory device 610 with the organic-based interposer 615 may be configured to meet various performance constraints of the host device 605. As such, as performance constraints change, so to can the exact configuration of the memory device 610.

Figure 6B:
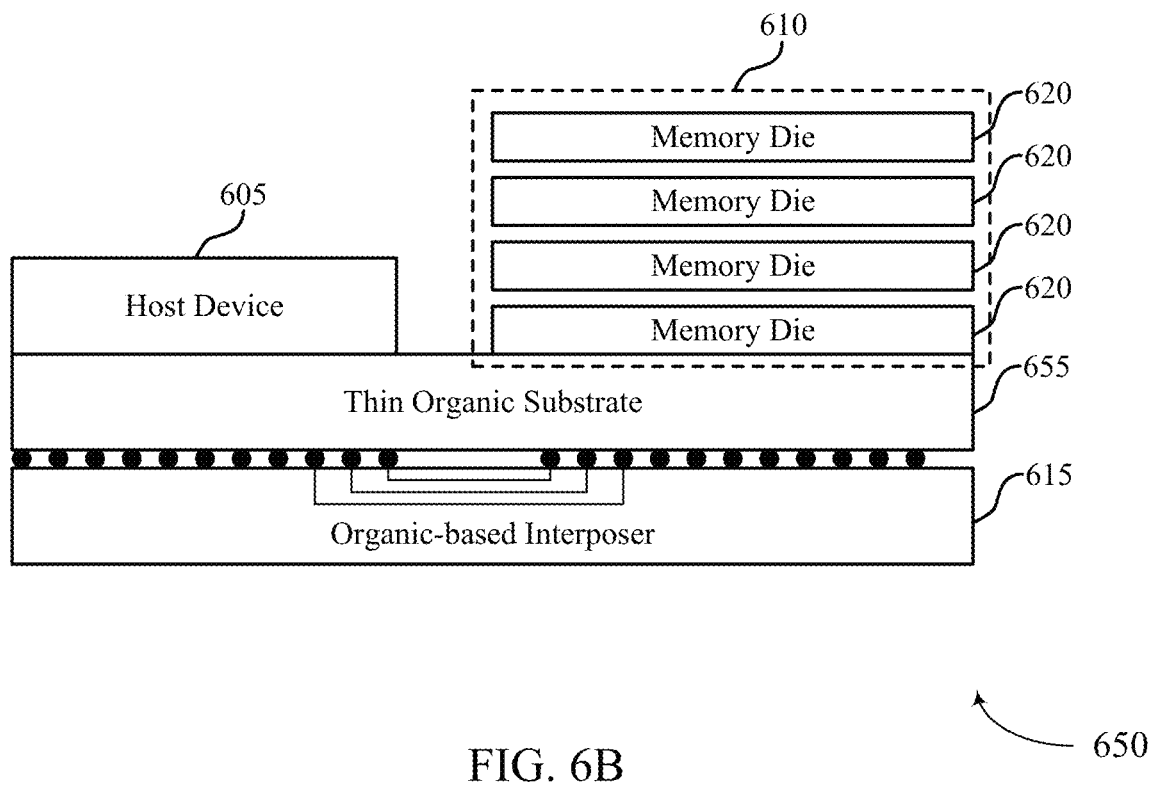

FIG. 6B illustrates an example of a device 650 that supports devices and methods for reconfigurable memory architectures in accordance with various examples of the present disclosure. The device 650 may be an example of a device where a host device 605 is coupled with a memory device 610 using an organic-based interposer 615. The device 650 may be similarly embodied as the device 600 except the device 650 includes an organic substrate 655 positioned between the organic-based interposer 615 and the host device 605 and between the organic-based interposer 615 and the memory device 610.

The organic substrate 655 may include multiple metal layers configured to couple the data pins of the memory dies 620 with the pins of the organic-based interposer 615. The organic substrate 655 may be configured to allow the memory device 610 to be tested (or otherwise activated) prior to being coupled with the host device 605. The organic substrate 655 may also be configured to allow the host device 605 to be coupled with the memory device 610 using IR reflow methods. In some cases, the organic substrate 655 may be between approximately 200 micrometers thick and approximately 300 micrometers thick. In some cases, the organic substrate 655 may be approximately 60 micrometers thick.

Figure 7:
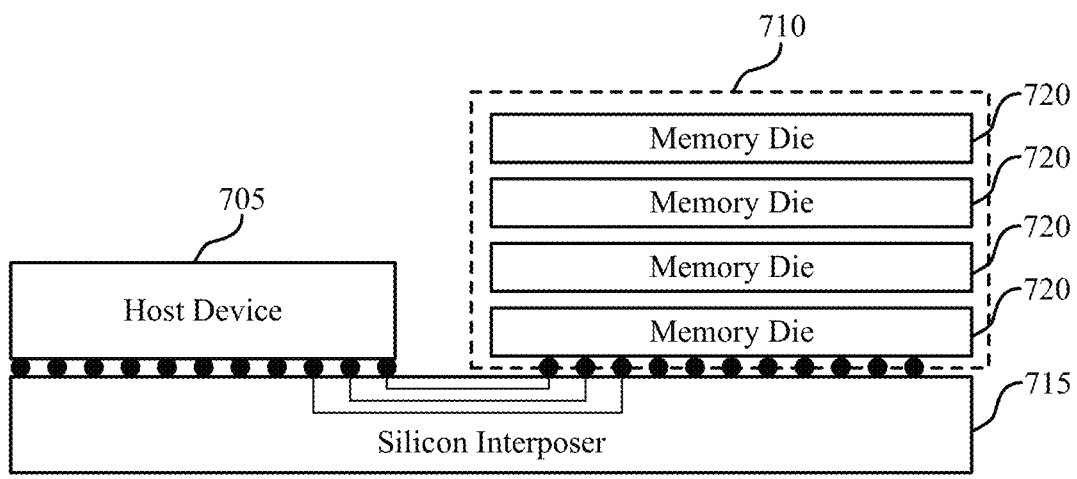
FIG. 7 illustrates an example of a device that supports devices and methods for reconfigurable memory architectures in accordance with examples of the present disclosure.

FIG. 7 illustrates an example of a device 700 that supports devices and methods for reconfigurable memory architectures in accordance with various examples of the present disclosure. The device 700 may be an example of a device where a host device 705 is coupled with a memory device 710 using a high-density interposer 715 (e.g., a silicon interposer or glass interposer). The device 700 may be an example of the device 200 described with reference to FIG. 2. The host device 705 may be an example of the host device 205 and other host devices described with reference to FIGS. 2-5. The memory device 710 may be an example of the memory devices 210, 300 and portions of memory devices described with reference to FIGS. 2-5. The high-density interposer 715 may be an example of the interposer described with reference to FIG. 3. The memory device 710 may include one or more memory dies 720. The memory dies 720 may be examples of the memory dies 305, memory die 400 as described with reference to FIGS. 3 and 4. In some cases, the memory dies 720 may be referred to as memory arrays, arrays of memory cells, or decks of memory cells.

Like the memory device 610 described with reference to FIG. 6, the various parameters and characteristics of the memory device 710 may be determined based on the performance constraints. Because the interposer 615 may be made of silicon, the specific configuration of the memory device 710 may be different than the memory device 610 to achieve the same performance constraints.

One difference between a high-density interposer 715 and an organic-based interposer 615 is that the resistance of the channels in the high-density interposer 715 is higher than the channels in the organic-based interposer. This is typical due to the channels of the high-density interposer 715 being smaller than the channels of the organic-based interposer 615. In some cases, the maximum practical data rate (given power consumption) of the high-density interposer 715 may be lower than the organic-based interposer 615. The difference in data rate may also lead to other parameters of the memory device 710 being different than the memory device 610.

In some examples, the memory device 710 with the high-density interposer 715 may be configured to meet a fixed performance constraint (e.g., 4 TB/s) of the host device 705. In such examples, the memory device 710 may have a data rate of 8 GB/s, the channel width of the data channel may be eight data pins (e.g., X8) with a at least two C/A pins, the quantity of banks of memory cells in a cell region may be sixteen, and the memory device 710 may include a 4-phase clock signal.

These various parameters of the memory device 710 with the high-density interposer 715 may be configured to meet various performance constraints of the host device 705. As such, as performance constraints change, so to can the exact configuration of the memory device 710.

One disadvantage of a high-density interposer 715 as compared with an organic-based interposer 615 may be the cost of the high-density interposer 715. The high-density interposer 715 has lower yield rates in manufacturing and therefore costs more. One advantage of the high-density interposer 715 may be that the performance of the high-density interposer may improve in the future. In some cases, the device 700 does not include an organic substrate positioned between the high-density interposer 715 and the host device 705 and the high-density interposer 715 and the memory device 610. In other cases, however, the device 700 may include an organic substrate (like the organic substrate 655) positioned between the high-density interposer 715 and the host device 705 and the high-density interposer 715 and the memory device 610.

Figure 8:
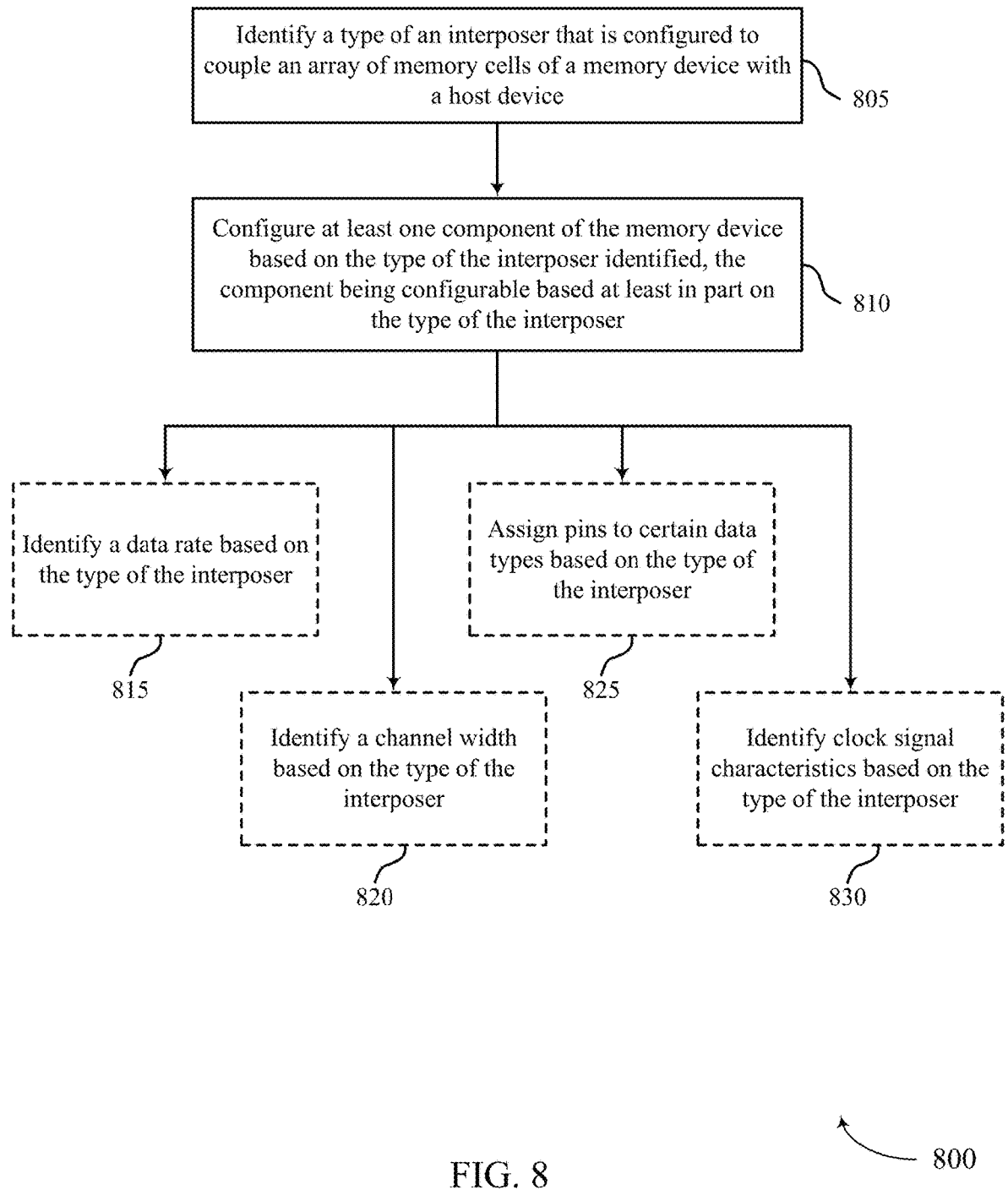
FIG. 8 illustrates an example of a method that supports devices and methods for reconfigurable memory architectures in accordance with examples of the present disclosure.

FIG. 8 illustrates an example of a method 800 that supports devices and methods for reconfigurable memory architectures in accordance with various examples of the present disclosure. When manufacturing memory devices it may be advantageous to build a single type of memory die and/or a single memory stack that is compatible with both an organic-based interposer (e.g., organic-based interposer 615) and a high-density interposer (e.g., high-density interposer 715). In this manner, as technology advancements occur and as memory needs change either an organic-based interposer or a high-density interposer may be used with the same memory stack.

Techniques are described herein for a reconfigurable memory die (or stack of memory dies) that is configurable based on the type of interposer used to couple the memory die with a host device. The reconfigurable memory die may include features for both a high-density interposer and an organic-based interposer. Various components of the reconfigurable memory die may be activated/deactivated based on what type of interposer is used. For example, if a high-density interposer is used, the data channel may be eight data pins wide. In contrast, if an organic-based interposer is used, the data channel may be four data pins wide. As such, a reconfigurable memory die may include data pins and related drivers that are inactive when an organic-based interposer is used, but are active when a high-density interposer is used.

The operations of method 800 may be implemented by a device 200 or its components as described herein. In some cases, the operations of method 800 may be performed by a processing component of the host device 205 as described with reference to FIG. 2. In some cases, the operations of method 800 may be performed by the memory device 210 as described with reference to FIG. 2, or a processing component of the memory device 210. In some cases, the operations of method 800 may be performed by a controller in a manufacturing facility. In some examples, a controller may execute a set of codes to control the functional elements of the device to perform the functions described below. Additionally or alternatively, the controller may perform aspects of the functions described below using special-purpose hardware.

At block 805, the controller may identify a type of an interposer that is configured to couple an array of memory cells of a memory device with a host device. In some cases, the identification occurs during the manufacturing process of the memory die or the stack of memory dies. The memory dies may be configured using a variety of different configurations. For example, the memory dies may include a certain quantity of pins, drivers, and/or receivers in data channels, where, in some configurations, not all of the pins, drivers, and/or receivers are used. The memory dies may be built such that the components are configurable based on one or more configuration commands.

At block 810, the controller may configure at least one component of the memory device based on the type of the interposer identified, the component being configurable based on the type of the interposer. The controller may transmit one or more configuration commands to the memory device. Such configuration commands may include commands to activate/deactivate one or more pins, one or more pin drivers, one or more pin receivers, or a combination thereof. Such pins may be used as data pins, C/A pins, ECC pins, CLK pins, or a combination thereof. Various parameters of the drivers and receivers may be configured as well by a configuration command. For example, a data rate (e.g., frequency) of the signals communicated using the pins, the phase of the signals communicated using the pins, the type of data transmitted over a specific pin, and/or combinations thereof. Examples of these reconfigurable characteristics are described with reference to blocks 815, 820, 825, 830.

In some cases, the controller may identify performance constraints of a host device that will be coupled with the memory device. Configuring the components may be based on the performance constraints and the type of the interposer being used.

At block 815, the controller may identify a data rate of information communicated using the interposer based on identifying the type of the interposer. The data rate may also be based on performance constraints of the host device configured to be coupled with the memory device. The data rate may also be based on a power consumption limitations associated with communicating signals across the type of the interposer. For example, a maximum practical data rate for a high-density interposer (e.g., silicon interposer) may be less than a maximum practical data rate for an organic-based interposer.

At block 820, the controller may identify a channel width of a data channel that couples a cell region of the array of memory cells with the host device based on identifying the type of the interposer. The channel width may also be based on performance constraints of the host device configured to be coupled with the memory device. The controller may activate/deactivate a quantity of pins, pin drivers, and/or pin receivers based on the channel width. In some configurations, the memory device may include one or more unused pins. The controller may also set one or more parameters of those various components (e.g., frequency, phase, modulation scheme) based on the type of the interposer.

In some cases, the controller may identify a maximum channel width of the memory device that is based on the quantity of pins of each data channel. The channel width determination may be based on the maximum channel width of the data channels.

At block 825, the controller may assign pins to communicate certain types of data for example. The controller may assign a pin to be a data pin, a C/A pin, a CLK pin, a RCLK pin, or an ECC pin based on the channel width and/or the type of the interposer. For example, if the channel width is less than a maximum channel width of the data channel, the controller may assign one or more of the pins to be ECC pins. In other examples, however, where the channel width is the maximum channel width, the controller may cause the memory device to not include a dedicated ECC pin.

At block 830, the controller may identify one or more clock signal characteristics based on the type of the interposer. The controller may also identify one or more clock signal characteristics based on the data rate, where the data rate may be based on the type of the interposer. In some cases, the memory device may have a clock signal of a certain frequency (e.g., four GHz). If the data rate is 16 GHz, the memory device may use four signals at 4 GHz having different phases to arrive at the 16 GHz clock. If the data rate is 8 GHz, the memory device may use two signals at 4 GHz having different phases to arrive at the 8 GHz clock. The controller may generate these clock signals (and assign pins accordingly) based on the type of the interposer and/or the data rate. In some cases, the phases of the clock signals may be zero degrees, 90 degrees, 180 degrees, and/or 270 degrees. In other cases, the phases may be any degree value to achieve the results described herein. The clock signal may use any frequency. As such, the amount of clock signals and the phases of the clock signals may be changed based on the clock frequency and the total data rate.

In some cases, the controller may reconfigure the memory device based on at least one of a plurality of predetermined configurations. In such examples, the controller may have one or more configurations associated with particular interposer type stored in a library of configurations. In some cases, the controller may dynamically configure each characteristic and component individually rather than using predetermined configurations.

In some cases, the controller may modify the components of the memory die or memory device from first configuration (sometimes a default configuration) to a second configuration. The controller may identify a current configuration of the memory device (e.g., a default configuration). The controller may also determine that the type of the interposer of the memory device is different from the type of the interposer associated with the first configuration. The controller may also identify a second configuration associated with the identified type of interposer. As such, the reconfiguration commands may include specific instructions about transitioning from the first configuration to the second configuration. For example, the controller may identify one or more inactive pins in the first configuration and the reconfiguration command may include instructions to activate one or more of those inactive pins, or vice versa.

In some cases, the controller may be configured to reconfigure the memory device even after it has been installed and coupled with the host device. Advances in technology may improve performance and capacities of certain features of the memory device. The controller may be configured reconfigure certain components and parameters of the memory device after the memory device is in operation. For example, the controller may adjust the channel width from x4 to x8.

Figure 9:
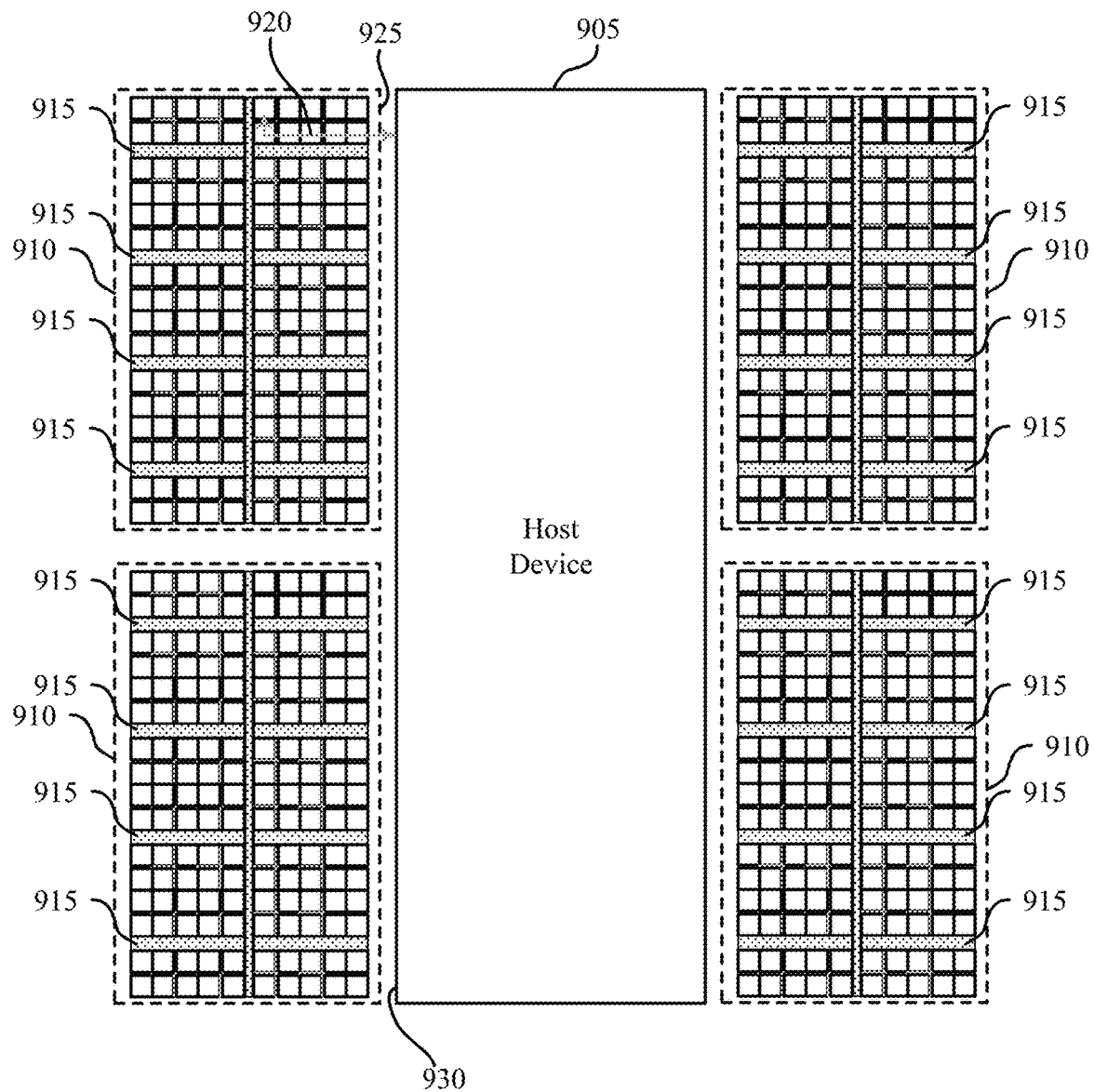
FIG. 9 illustrates an example of a device that supports devices and methods for reconfigurable memory architectures in accordance with examples of the present disclosure.

FIG. 9 illustrates an example of a device 900 that supports devices and methods for reconfigurable memory architectures in accordance with various examples of the present disclosure. The device 900 may be an example of a device where a host device 905 is coupled with a memory device 910 using an interposer (whether organic-based or silicon). The device 900 may be an example of the device 200, 600, or 700 described with reference to FIGS. 2-7. The host device 905 may be an example of the host device 205, 605, 705 and other host devices described with reference to FIGS. 2-7. The memory device 910 may be an example of the memory devices 210, 300, 610, 710 and portions of memory devices described with reference to FIGS. 2-7.

The device 900 illustrates an orientation of the memory device 910 relative to the host device 905. In some cases, the routing of channels (e.g., I/O areas 915 and data channels 920) through the memory device 910 may impact the maximum data transfer rate between the host device 905 and the memory device 910. For example, the length of channels may impact the data transfer rate. Some orientations of the memory device 910 relative to the host device 905 may impact the length and the complexity of the channels. For example, in certain orientations of the memory device 910 (e.g., device 1000), the data channels may be forced to either cross the I/O area or circumvent the I/O area. Such conditions may increase the length of the data channel as compared with other solutions, may increase cross-talk between different channels (e.g., I/O areas and data channel), may the power necessary to communicate signals using the data channel, may decrease a data rate of the signals communicated using the data channel, or a combination thereof.

The device 900 includes memory devices 910 are positioned and oriented relative to the host device 905 such that the data channels do not need to cross the I/O areas. Such a configuration may reduce the length of the data channel and therefore increase a data rate of information transfer given a certain transmit power.

The I/O areas 915 may be configured to connect a plurality of memory cells (including banks of memory cells and cell regions) to power and/or ground or virtual ground. To get power and ground to the various decks of memory cells in the memory device 910, the I/O area 915 may include a plurality of through-silicon-vias (TSVs). The TSVs of the I/O areas 915 may occupy a large amount of die space and may be packed tightly in the I/O region, thereby making it difficult to route other channels (e.g., data channel) through the I/O area 915.

In some cases, the I/O area 915 of the memory device 910 may be configured to extend in a first direction away from an edge 925 of the memory device 910 configured to be positioned directly adjacent to the host device 905. In some instances, the first direction of the I/O area 915 may be orthogonal to the edge 925 of the memory device 910 or an edge of the host device 905 or a combination thereof. In cases such as this, the data channels 920 of the memory device 910 also may extend in the first direction and may couple a memory cell to the host device 905 without crossing the I/O areas 915. The data channels 920 may extend parallel to the I/O areas 915. In some examples, the data channel 920 may be physically isolated from the I/O area 915.

In the device 900, the quantity of coupled memory devices 910 and the die size of those memory devices 910 may be based on a memory size of the memory device 910. In some examples, four memory devices 910 may be coupled with the host device 905 and the memory device 910 may include 160 banks of memory cells in a single memory die. The memory device 910 may include any quantity of memory dies stacked on top of one another.

Figure 10:
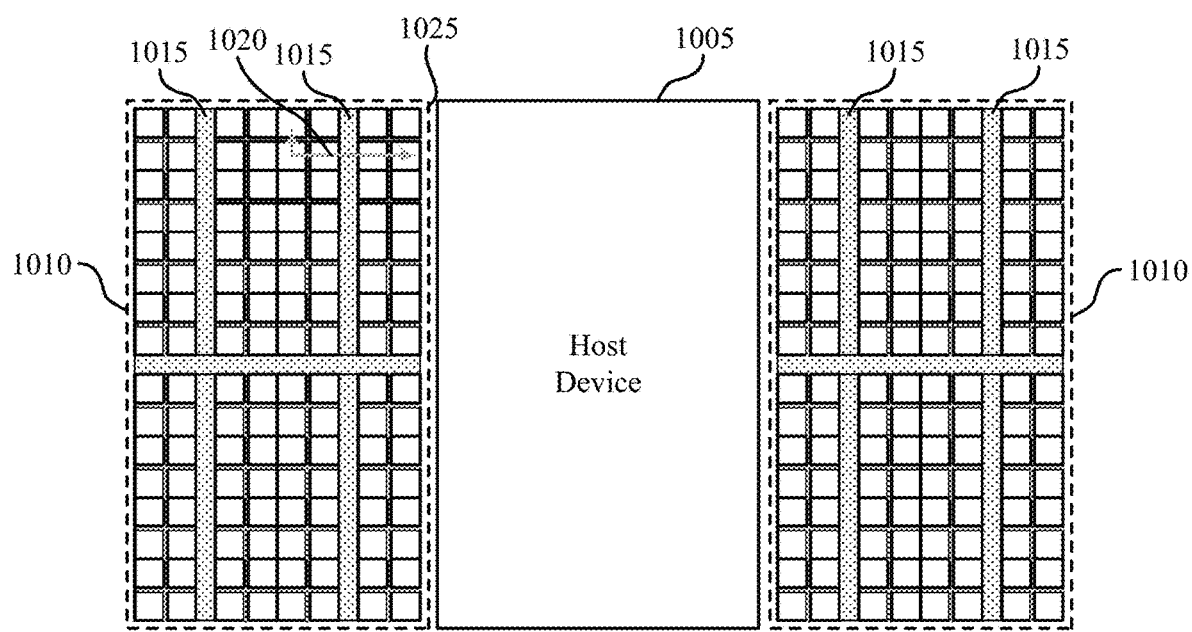
FIG. 10 illustrates an example of a device that supports devices and methods for reconfigurable memory architectures in accordance with examples of the present disclosure.

FIG. 10 illustrates an example of a device 1000 that supports devices and methods for reconfigurable memory architectures in accordance with various examples of the present disclosure. The device 1000 may be an example of a device where a host device 1005 is coupled with a memory device 1010 using an interposer (whether organic-based or silicon). The device 1000 may be an example of the device 200, 600, or 700 described with reference to FIGS. 2-7. The host device 1005 may be an example of the host device 205, 605, 705 and other host devices described with reference to FIGS. 2-7. The memory device 1010 may be an example of the memory devices 210, 300, 610, 710 and portions of memory devices described with reference to FIGS. 2-7.

The device 1000 illustrates an orientation of the memory device 1010 relative to the host device 1005. In the memory device 1010, a I/O area 1015 extends in a second direction parallel to an edge 1025 of the memory device configured to be directly adjacent to the host device 1005. In such an orientation, a data channel 1020 may cross the I/O area 1015 to reach the host device 1005. Such a crossing may create cross-talk between the pins of the I/O area 1015 and the pins of the data channel 1020. Too many of these crossings may increase the die array needed for the I/O area or may cause the data channel 1020 to be rerouted around at least some of the I/O areas 1015.

In the device 1000, the quantity of coupled memory devices 1010 and the die size of those memory devices 1010 may be based on a memory size of the memory device 1010. In some examples, six memory devices 1010 may be coupled with the host device 1005 and the memory device 1010 may include 80 banks of memory cells in a single memory die. The device 1000 may include any quantity of memory devices 1010. The memory device 1010 may include any quantity of memory dies stacked on top of one another.

Figure 11:
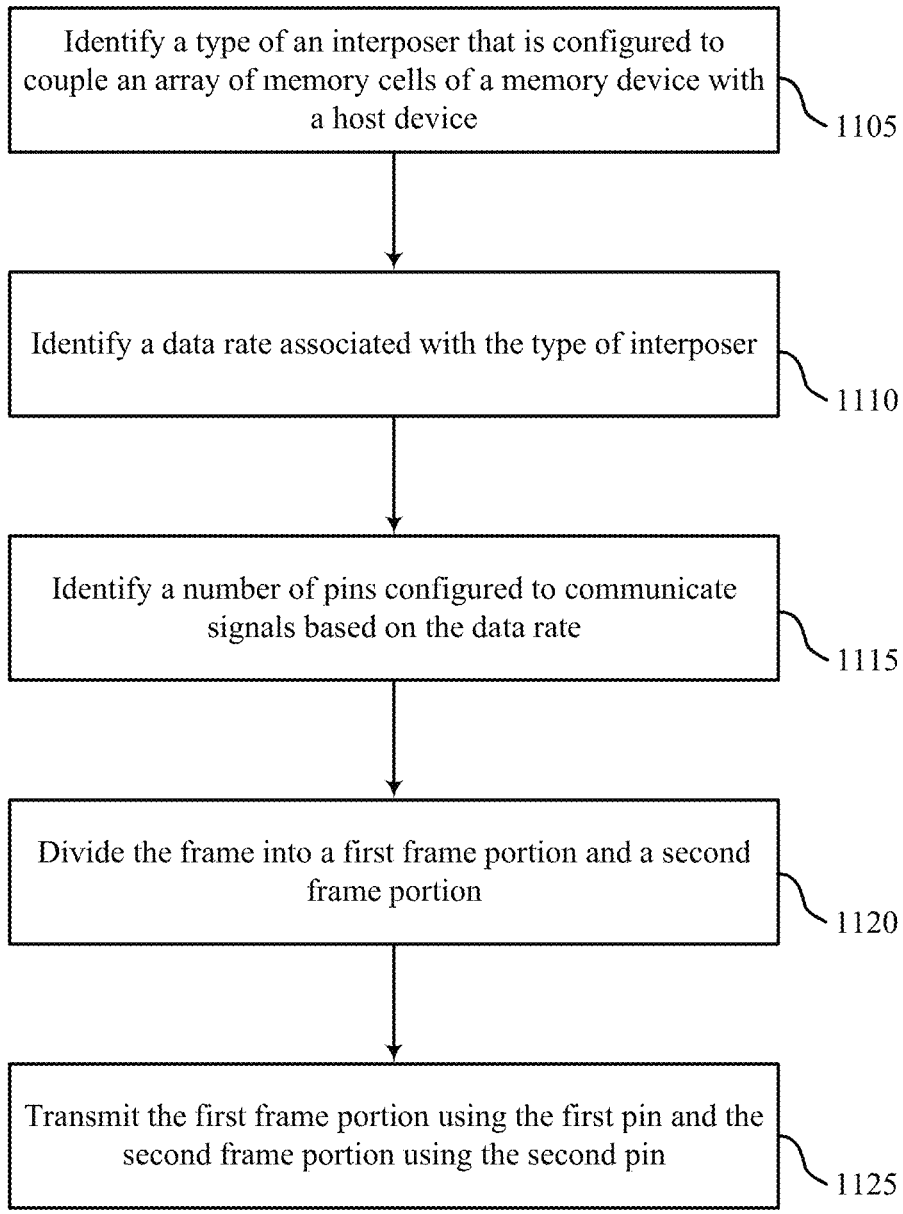
FIG. 11 illustrates an example of a process that supports devices and methods for reconfigurable memory architectures in accordance with examples of the present disclosure.

FIG. 11 illustrates an example of a method 1100 that supports devices and methods for reconfigurable memory architectures in accordance with various examples of the present disclosure. When manufacturing memory devices it may be advantageous to build a single type of memory die and/or a single memory stack that is compatible with both an organic-based interposer (e.g., organic-based interposer 615) and a high-density interposer (e.g., high-density interposer 715). In this manner, as technology advancements occur and as memory needs change either an organic-based interposer or a high-density interposer may be used with the same memory stack.

The structure of the frames used by the memory device and the host device may be altered based on the type of interposer used. Aspects of the frame structures and the frame protocols are discussed in greater detail with reference to FIGS. 12-16. In some cases, an organic-based interposer may have a different data rate than the high-density interposers. For example, an organic-based interposer may have a data rate of 16 GB/s while a high-density interposer may have a data rate of 8 GB/s. To meet the same overall performance constraints, the high-density interposer may have twice as many data pins to transmit twice as much data at half the data rate. Because the memory device with the high-density interposer is transmitting data over two pins instead of one (relative to the organic-based interposer), the memory device may need to alter the frame structure accordingly. To be compatible with both types of interposer, one of the frame structures may be a default frame structure. For example, a default frame structure may be frames having a length of eighteen symbols for a data rate of 16 GB/s. If the data rate is less than the default rate, the memory device may be configured to adjust the frame structure accordingly to satisfy overall performance constraints.

The operations of method 1100 may be implemented by a device 200 or its components as described herein. In some cases, the operations of method 800 may be performed by a processing component of the host device 205 as described with reference to FIG. 2. In some cases, the operations of method 1100 may be performed by the memory device 210 as described with reference to FIG. 2, or a processing component of the memory device 210. In some cases, the operations of method 1100 may be performed by a controller in a manufacturing facility. In some examples, a controller may execute a set of codes to control the functional elements of the device to perform the functions described below. Additionally or alternatively, the controller may perform aspects of the functions described below using special-purpose hardware.

At block 1105, the controller may identify a type of an interposer that is configured to couple an array of memory cells of a memory device with a host device. In some cases, the identification occurs during the manufacturing process of the memory die or the stack of memory dies. The memory dies may be built to be configured using a variety of different configurations. For example, the memory dies may include one or more pins, drivers, and/or receivers in data channels, where, in some configurations, not all of the pins, drivers, and/or receivers are used. The memory dies may be built such that the components are configurable based on one or more configuration commands.

At block 1110, the controller may identify a data rate associated with the type of interposer. The identified data rate may also be based on the overall performance constraints.

At block 1115, the controller may identify one or more pins configured to communicate signals based on the data rate. To maintain overall performance constraints a may controller may configure a channel in one or more different ways. The controller may configure a relatively narrow channel to communicate information with a high data rate or the controller may configure a relatively wider channel to communicate information at a slower data rate. When the controller configures the second option, to maintain the speed of individual frames, the controller may divide the frames to transmitted in parallel.

At block 1120, the controller may divide a frame (either data or command frame) into one or more portions. The quantity of portions may be based on the channel width of a data channel used to communicate the data. In some examples, the quantity of portions may be equal to the quantity of pins used to the communicate the data. In some examples, the quantity of portions may be based on the performance constraints, the data rate, and the quantity of pins to communicate the data.

At block 1125, the controller may transmit the frame portions over their respective pins. In such a manner, the first frame portion may be transmitted using the first pin in parallel with the second frame portion being transmitted using the second pin.

Figure 12:
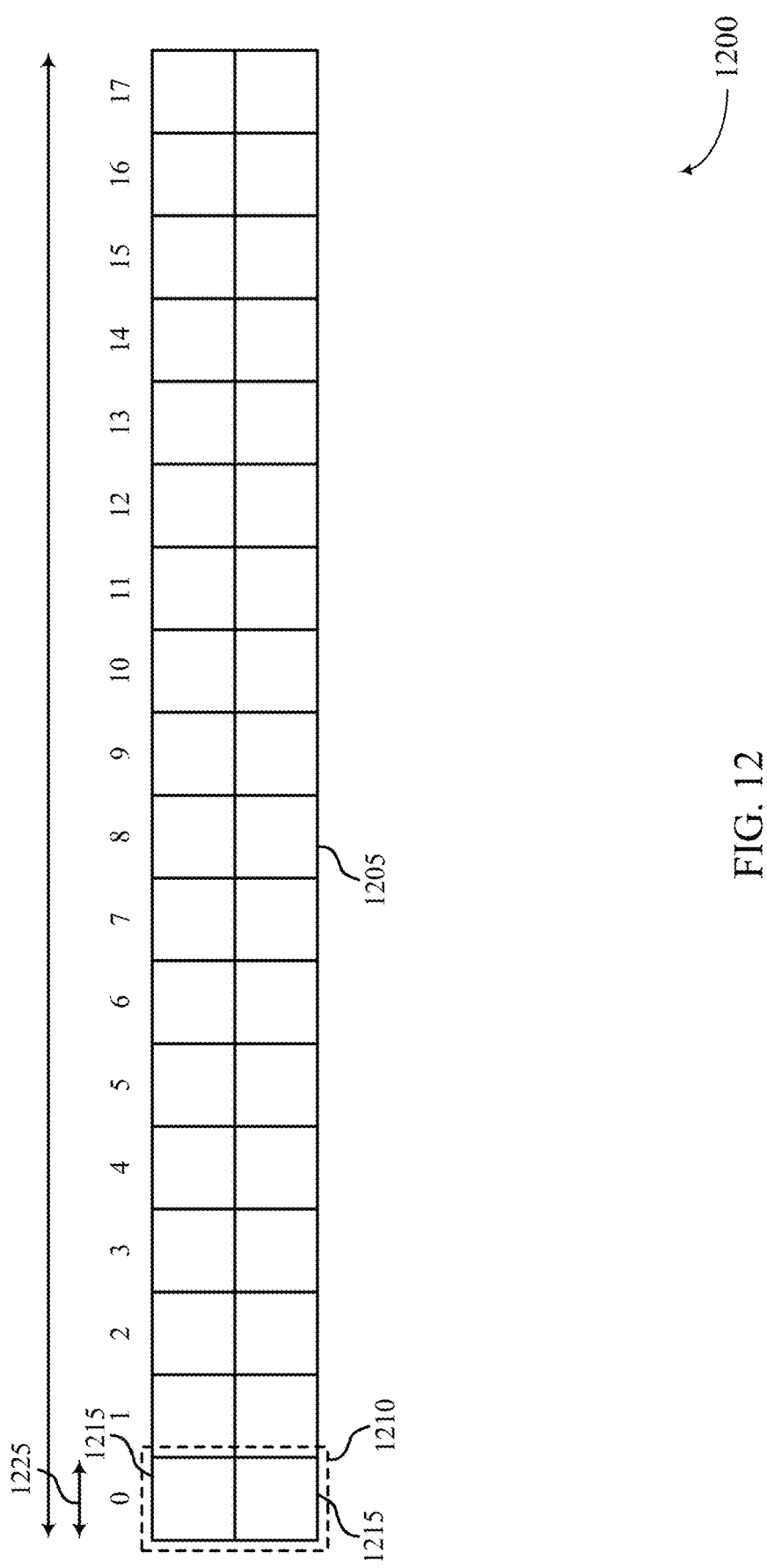
FIG. 12 illustrates an example of a frame structure that supports devices and a method or methods for reconfigurable memory architectures in accordance with examples of the present disclosure.

FIG. 12 illustrates an example of a frame structure 1200 that supports devices and methods for reconfigurable memory architectures in accordance with various examples of the present disclosure. The frame structure 1200 may be configured as a data transmission unit for communicating data with a memory device and communicating data within the memory device. In some cases, the frame structure 1200 may be configured to maximize data transfer rates between a host device and the memory device. In some cases, the frame structure 1200 may be reconfigurable based on the type of interposer used in the memory device.

The frame structure 1200 may comprise a frame 1205 that includes a plurality of symbols 1210. The symbols 1210 may represent one or more bits 1215 of data. In the illustrative example of FIG. 12, the frame 1205 uses a multi-symbol modulation scheme (e.g., a M-ary modulation scheme where M>2) to encode data in a signal. Each symbol in the multi-symbol modulation scheme may represent two or more bits of data. Examples of the multi-symbol modulation scheme may include a pulse amplitude modulation scheme (PAM), a quadrature amplitude modulation scheme (QAM), a quadrature phase shift keying (QPSK) modulation scheme, or a combination thereof. In some cases, the modulation scheme for the frame 1205 may be an example of a four-symbol PAM scheme (e.g., PAM4). In some cases, the frame 1205 may use a binary-symbol modulation scheme (e.g., a M-ary modulation scheme where M=2) to encode data in a signal. Each symbol in a binary-symbol modulation scheme may represent one or more bits of data. Example of the binary-symbol modulation scheme may include a non-return-to-zero (NRZ) modulation scheme.

In some cases, the type of modulation scheme used to communicate data by the memory device may be configurable based on the type of the interposer used in the memory device. For example, if the memory device includes a high-density interposer, the memory device may use a multi-symbol modulation scheme (e.g., PAM4). In some cases, certain pins may use a first type of modulation scheme and other pins may use a second type of modulation scheme different from the first modulation scheme.

The frame 1205 also includes a frame length 1220 that indicates a size of the frame. The frame length 1220 may be expressed in terms of numbers of symbols or length of time. In the illustrative example, the frame length 1220 is eighteen symbols long. The frame 1205 may be any frame length 1220, but both the receiving component and the transmitting component typically both know the frame length 1220 to facilitate more efficient communication.

In some cases, the frame length 1220 may be fixed based on agreed upon standards for the memory device. In some cases, the frame length 1220 may be dynamically determined by a host device, a memory device, or a combination thereof. For example, during an activation time period, the host device may select and a communicate a frame length with the memory device, or vice-versa. In some cases, the frame length 1220 could be selected from a set of predetermined frame lengths. For example, the memory device may include a first predetermined frame length that includes cyclic redundancy code (CRC) bits and a second predetermined frame length hat does not include cyclic redundancy code bits. In some specific examples, the frame length may be configurable between a length of 18 symbols and a length of 14 symbols.

The frame 1205 may also include a symbol length 1225 that indicates a size of the symbol 1210 or a length of the symbol 1210. The symbol length may be expressed in terms of clock cycles or time. The symbol length 1225 indicates the length of time it takes to transmit a single symbol. The symbol length 1225 may be based on the clock frequency of the host device, the memory device, or a combination thereof.

Figure 13:
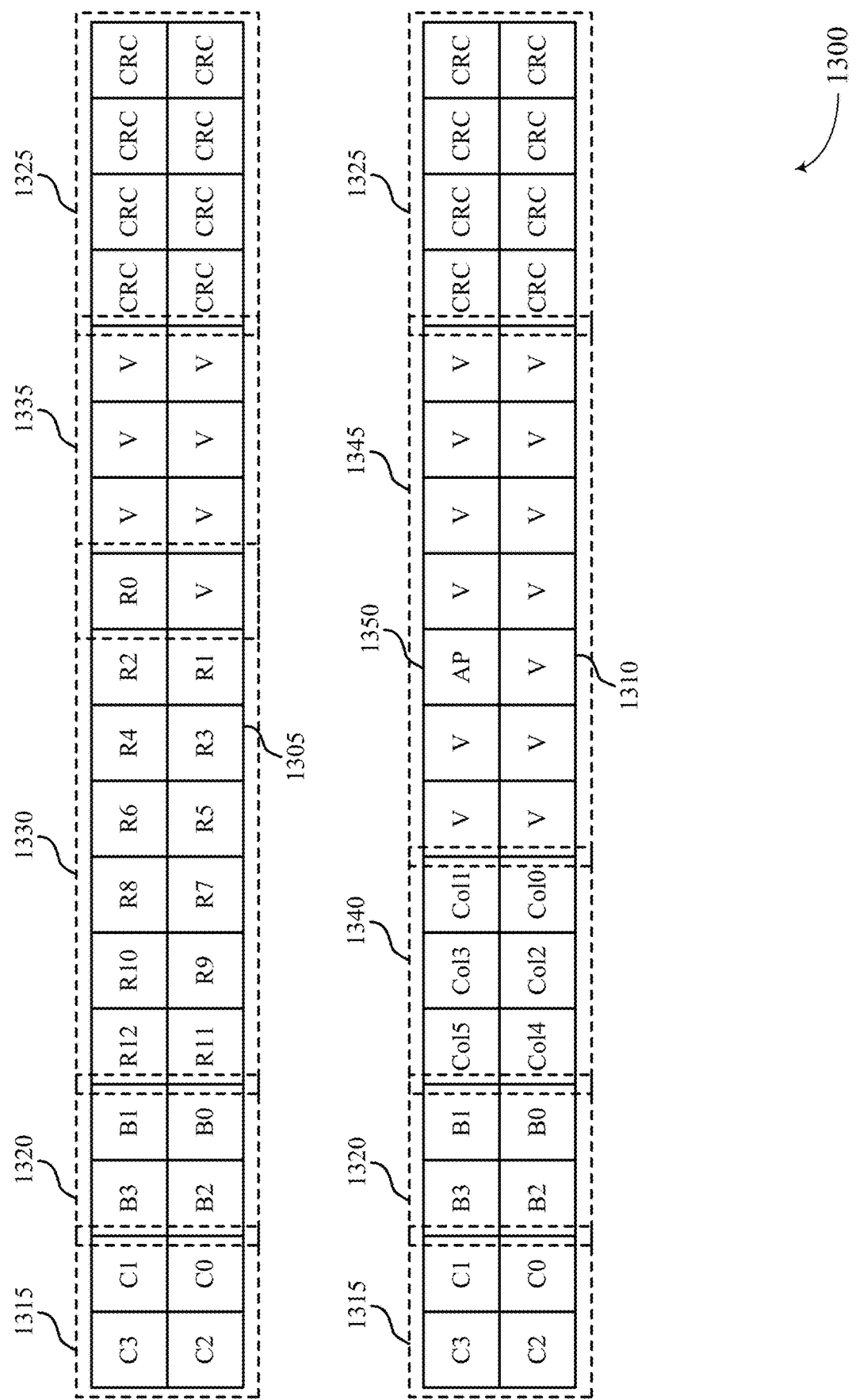
FIG. 13 illustrates an example of a frame structure that supports devices and a method or methods for reconfigurable memory architectures in accordance with examples of the present disclosure.

FIG. 13 illustrates an example of a frame structure 1300 that supports devices and methods for reconfigurable memory architectures in accordance with various examples of the present disclosure. The frame structures 1300 may be examples of the frame structure 1200 described with reference to FIG. 12. The frame structures 1300 include a first frame 1305 and a second frame 1310. The frames 1305, 1310 may be examples of command frames communicated using a C/A pin. Other command frames, data frames, and/or clock frames may have a different frame structure. The specific examples of the frames 1305, 1310 may be frames received by a memory device from a host device, where the host device issues commands to the memory device.

Both the first frame 1305 and the second frame 1310 may include a section of command bits 1315, a section of bank address bits 1320, and a section of CRC bits 1325. The command bits 1315 indicate a command associated with the frame. For example, the command bits may indicate that the frame is associated with a write operation, a read operation, an activate operation, a precharge operation, a refresh operation, a mod register operation, or a combination thereof. The structure of the rest of the frame may be based on the command in the command bits 1315. For example, if the command bits 1315 indicate a first command, the frame may be structured like the frame 1305; and if the command bits indicate a second command different from the first command, the frame may be structured like the frame 1310. The bank address bits 1320 may identify an address for the bank of memory cells associated with the command in the command bits 1315. The CRC bits 1325 may be used for redundancy coding, error detection, and/or error correction.

The first frame 1305 may also include a section of row address bits 1330 and a section of reserved bits 1335. The row address bits 1330 may be included in the frame 1305 based on the command type in the command bits 1315. The quantity of row address bits 1330 may vary based on the command in the command bits 1315 and/or different frame structures. The reserved bits 1335 are bits that may be used for a variety of payload issues associated with command in the command bits 1315. The quantity of reserved bits 1335 may vary based on the command in the command bits 1315 and/or different frame structures.

The second frame 1310 may also include a section of column address bits 1340, a section of reserved bits 1345, and an auto precharge bit 1350. The column address bits 1340 may be included in the frame 1310 based on the command type in the command bits 1315. The quantity of column address bits 1340 may vary based on the command in the command bits 1315 and/or different frame structures. The reserved bits 1345 may be an example of the reserved bits 1335 described above. The auto precharge bit 1350 may be indicate to the memory device to automatically turn off a row at the end of the operation indicated in the frame 1310.

The frames 1305, 1310 may be modulated using a multi-symbol modulation scheme (e.g., PAM4). As such, each symbol of the frames 1305, 1310 represent at least two bits. In the illustrative examples, the certain bits are mapped to a most significant bit (MSB) or a least significant bit (LSB) of a particular symbol. The information in the frames may be mapped to the symbols, MSBs, and/or LSBs in any configuration. For example, in the illustrative cases, the command bits 1315 are mapped to the MSBs and the LSBs of two bits. In another example, the command bits 1315 may be mapped to the MSBs (or LSBs as the case may be) of four different symbols. In some cases, the command bits 1315 may be scattered throughout the frame, rather than being grouped. A person of ordinary skill would appreciate the variety of different mappings for the frame structure that are possible.

As discussed previously, the host device and a memory device may be configured to transfer large amounts of data quickly. For example, the host device may request that the memory device communicate data at or around 4 TB/s. To facilitate such high data rates, the frames 1305, 1310 do not include a header. A header may be any sections of bits or symbols that indicate to the receiver, the beginning and/or the end of the payload data. Such headers are overhead that may reduce the overall rate of data transfer between the host device and the memory device. Without headers, however, the memory device and the host device may need a different mechanism to identify when a frame begins and when a frame ends.

Techniques are described herein for a training procedure that identifies a frame boundary and generates a frame clock and a frame synchronization procedure to identify the beginning and the end of a frame. After the training procedure is complete, a memory device may be configured to initiate the frame synchronization procedure to identify the beginning of a frame based on the frame clock without the use of headers within the frame. During an activation time period after a power-up event, the memory device may initiate the training procedure to identify a frame boundary. Once the frames are synchronized, the memory device may be configured to execute a frame synchronization procedure that uses that frame clock during an entire active session (e.g., until a power-down event) to identify the beginning of a frame. In some cases, the frame structure may be reconfigurable based on the type of interposer used to couple a host device with a memory device.

In some cases, a leading frame may indicate information about a plurality of subsequent frames or an action that should be taken with respect to the plurality of subsequent frames. In such a case, the leading frame may not act as a header indicating when the frame actually starts, the beginning of the frame may be determined by the frame clock. Rather, the leading frame may indicate relationships between frames (whether command frames or data frames) that enable the memory device to execute more complex commands and operations.

Figure 14:
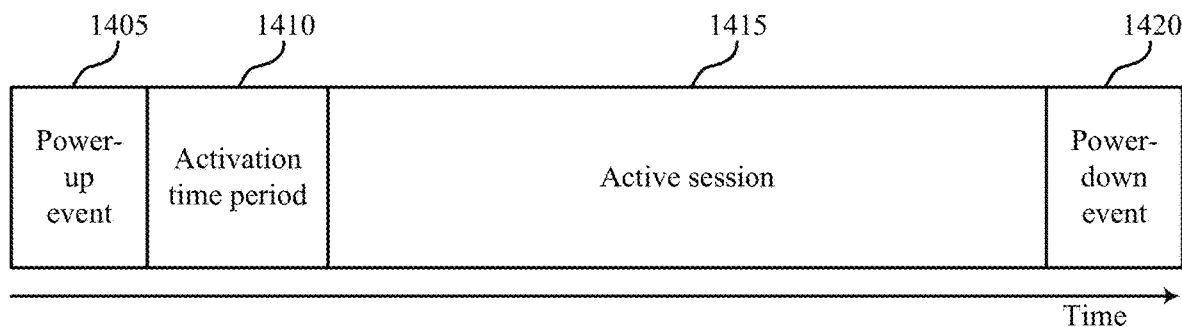
FIG. 14 illustrates an example of a timeline that supports devices and a method or methods for reconfigurable memory architectures in accordance with examples of the present disclosure.

FIG. 14 illustrates an example of a timeline 1400 that supports devices and methods for reconfigurable memory architectures in accordance with various examples of the present disclosure. The timeline 1400 shows events that may occur at a memory device. The timeline 1400 indicates a timing for performing a training procedure and/or a frame synchronization procedure. During an active session, the memory device may be configured to identify the beginning of a frame based on a frame clock without reinitializing a training procedure.

The timeline 1400 may include a power-up event 1405, an activation time period 1410, an active session 1415, and a power-down event 1420. When the memory device is powered down, the memory device may be communicating little to no information with the host device. As such, frame synchronization may not needed at that time. A power-up event, is any event where the memory device begins an active session 1415. A power-up event 1405 may be transition from an off-state to an active state or from a low-power state to the active state. The active session 1415 may refer to a period of time when the memory device is servicing the memory needs of a host device. The active session 1415 may refer to a continuous period of time where the memory device is operating without interruption (e.g., without powering down in any way).

Before beginning the active session 1415, the memory device may have to initialize one or more parameters to provide full functionality to the host device. The memory device may initialize these parameters during the activation time period 1410. During the activation time period 1410, the memory device may initiate one or more procedures to bring functionality to the memory device. For example, during the activation time period 1410, the memory device may initiate an eye synchronization procedure, a frame training procedure, a frame synchronization procedure, and/or other procedures, or a combination thereof.

During the activation time period 1410, the memory device may receive a clock of the host device and may determine a rising or falling edge of a symbol. Once the memory device has identified a correct timing for the symbols received from the host device, the memory device may initialize a frame training procedure during the activation time period 1410.

Figure 15:
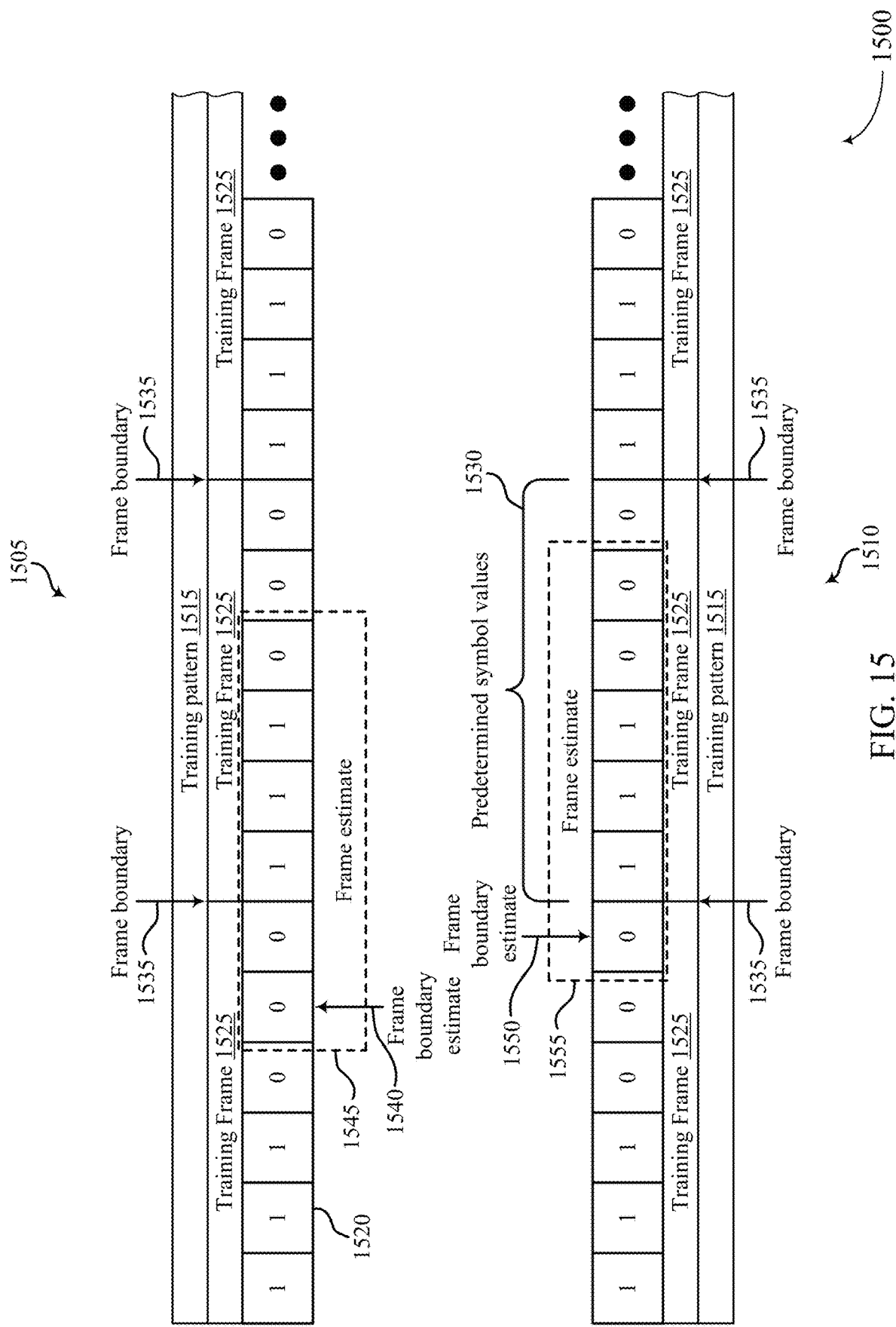
FIG. 15 illustrates an example of a structure for a frame training procedure that supports devices and methods for reconfigurable memory architectures in accordance with examples of the present disclosure.

FIG. 15 illustrates an example of a structure 1500 for a frame training procedure that supports devices and methods for reconfigurable memory architectures in accordance with various examples of the present disclosure. The structure 1500 shows two instances (e.g., first instance 1505 and second instances 1510) of a training pattern 1515. Each instance 1505, 1510 shows a step in the frame training procedure.

The frame training procedure is a process by which the memory device identifies a correct frame boundary. With the frame boundary, the memory device may generate a frame clock, which is used to identify frame boundaries (i.e., the start and stop of a frame) during an entire active session. The frame clock may be based on a system clock, a symbol length, and a frame length. In some cases, the frame clock is a virtual clock that relies on the system clock for its timing. In other cases, the frame clock is a physical clock that is initialized to track the frames.

The training pattern 1515 comprises a long train of symbols 1520 that are set to predetermined symbol values used to identify a frame boundary. The training pattern 1515 may comprise a plurality of training frames 1525, each training frame 1525 comprising an ordered set of predetermined symbol values 1530. An example of the symbol values may be a set of logic '1's followed by a set of logic '0's, or vice versa. The training frame 1525 may have a frame length that is equal to a frame length of the frames transmitted by the host device during the active session. Using a plurality of training frames, the memory device may be configured to determine a frame boundary 1535 and generate a frame clock that is used to identify the beginning of frames (or the end as the case may be) during the active session.

During the activation time period and as part of a frame training procedure, a host device may transmit the training pattern 1515 to the memory device. The memory device may determine when the training pattern is being transmitted so that it may be ready to initialize the frame training procedure.

As shown in the first instance, 1505, upon receiving the training pattern 1515, the memory device identify a symbol of the training pattern as a first frame boundary estimate 1540. Using the first frame boundary estimate and/or a known frame length, the memory device may generate a first frame estimate 1545. The first frame estimate 1545 include a quantity of symbols of the training pattern 1515 equal to the frame length of a training frame 1525. The memory device may identify the ordered set of symbols of the first frame estimate 1545. The memory device may compare the ordered set of symbols of the first frame estimate 1545 to the ordered set of predetermined symbol values 1530.

If the ordered set of symbols of the first frame estimate 1545 matches the ordered set of predetermined symbol values 1530, the memory device may identify the rising edge of the symbol that comprises the first frame boundary estimate 1540 as the frame boundary. If the sets do not match, the memory device may a second frame boundary estimate 1550 and a second frame estimate 1555 as shown in the second instance 1510. The memory device may then repeat the same process of comparing the set of symbol values in the second frame estimate 1555 to the ordered set of predetermined symbol values 1530. This process may continue until a correct frame boundary is found.

In some cases, the difference between the first frame boundary estimate 1540 and the second frame boundary estimate 1550 may be one symbol. In such cases, the memory device may slip the boundary estimate one symbol upon determining that the frame boundary is not correct. In other cases, the memory device may select the second frame boundary estimate 1550 based on a predetermined symbol distance (e.g., one, two, three, four, five, six symbols, etc.). In some cases, the memory device may select the second frame boundary estimate based on the ordered set of symbol values found in the first frame estimate 1545. For example, if the memory device knows that the predetermined set of symbol values is 111000 and the set of symbol values of the first frame estimate 1545 is 001110, the memory device may identify the third symbol of the first frame estimate 1545 as the second frame boundary estimate 1550.

Once the memory device identifies the correct frame boundary, the memory device may generate a frame clock based on the frame synchronization process. The frame clock may indicate the beginning of a new frame through the active session. Using the frame clock, the memory device and the host device may not need to use headers to indicate the location of frames, thereby freeing up more symbols for substantive data. In some cases, the frame boundary may be aligned with a rising edge of a first symbol (or a first symbol period) in the frame. As such, the frame clock may also be aligned with a rising edge of the symbol period of the frame.

Figure 16:
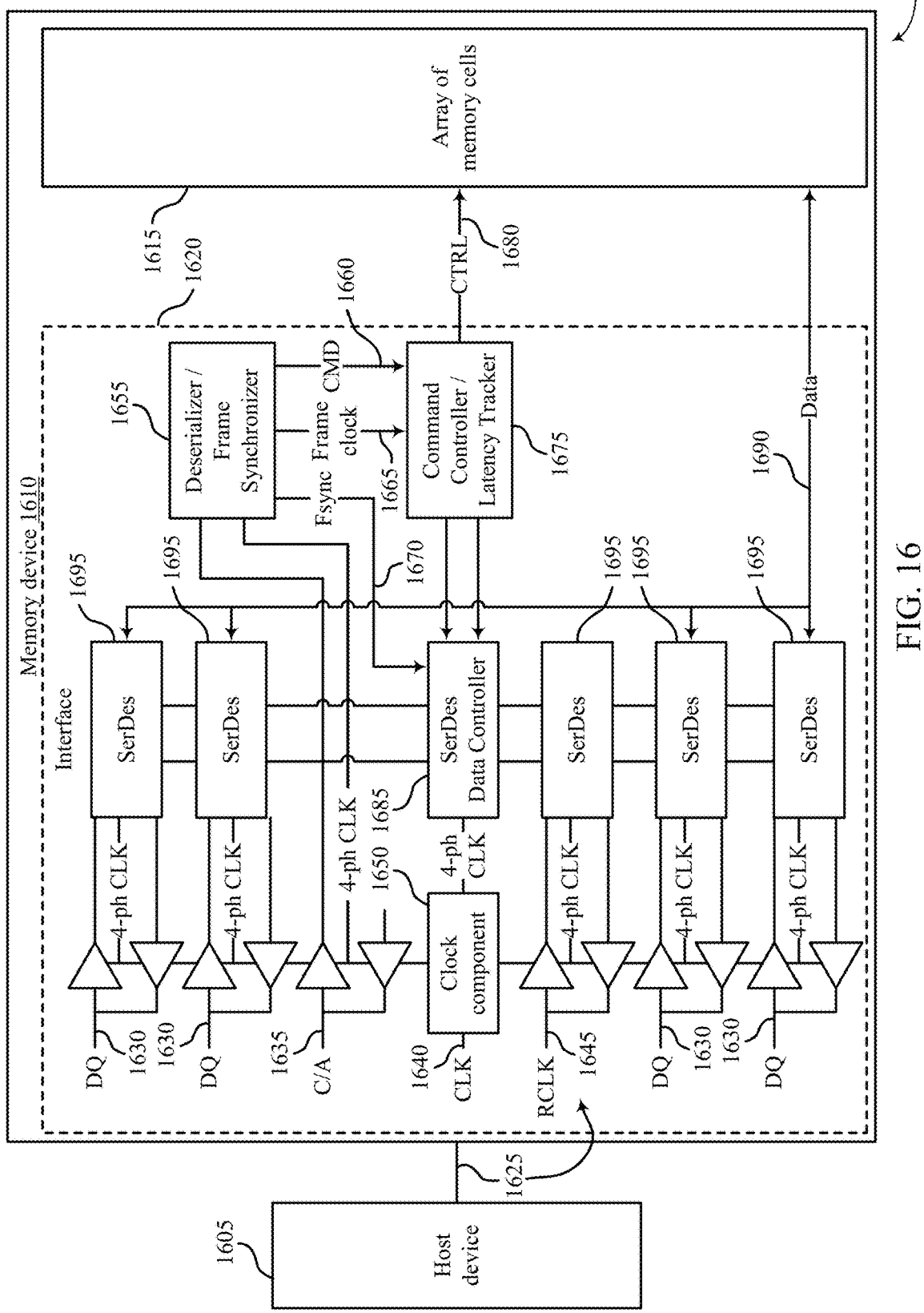
FIG. 16 illustrates an example of a device that supports devices and methods for reconfigurable memory architectures in accordance with examples of the present disclosure.

FIG. 16 illustrates an example of a device 1600 for a frame training procedure that supports devices and methods for reconfigurable memory architectures in accordance with various examples of the present disclosure. The device 1600 includes a host device 1605 and a memory device 1610. The device 1600 may be an example of the device 200, 600, 700, 900, or 1000, or similar described devices described with references to FIGS. 2-10.

The memory device 1610 may include an array of memory cells 1615 and an interface 1620. The interface 1620 may comprise features of a data channel 1625 that is configured to couple the host device 1605 with the array of memory cells 1615. The array of memory cells 1615 may refer to a deck of memory cells, a cell region of memory cells, a bank of memory cells, an individual memory cell, or any other combination of memory cells. While the data channel 1625 is shown as a single line, the data channel may include a plurality of pins, for example, the pins shown in the interface 1620.

The interface 1620 illustrates the some components that may be associated with various pins of a data channel 1625. The data channel 1625 may have any channel width. The data channel 1625 illustrated herein has a width of X4 (e.g., four data pins). The data channel includes a four data (DQ) pins 1630, a command/address (C/A) pin 1635, a clock (CLK) pin 1640, and a register clock (RCLK) pin 1645.

The interface 1620 may include a clock component 1650 configured to receive a clock signal of the host device 1605 using the CLK pin 1640 and generate a multi-phase clock signal for use in the memory device 1610. In some cases, the multi-phase clock signal may comprise two clock signals having a 0 degree phase and 180 degree phase respectively or four clock signals having a 0 degree phase, 90 degree phase, a 180 degree phase, and a 270 degree phase. The quantity of clock signals, the frequency of the memory device's clock signal, the phases of the clock signals may be based on the frequency of the clock signal of the host device 1605, the bandwidth performance constraints of the host device 1605 for transferring data with the memory device 1610, the data rate of the memory device 1610, or a combination thereof. The clock component 1650 may output a clock signal that is used by the other components of the interface.

The interface 1620 may include a frame synchronizer 1655 configured to execute a frame training procedure and generate a frame clock. The frame synchronizer 1655 may implement the frame training procedure according to the processes described with reference to FIGS. 14 and 15. The frame synchronizer 1655 may be coupled with the clock component 1650 and the C/A pin 1635. The frame synchronizer 1655 may be configured to execute a frame synchronization procedure to identify the beginnings of frames based on the frame clock it generates during an active session. In some examples, the frame synchronizer also deserializers the signals received using the C/A pin 1635.

The frame synchronizer 1655 may output a plurality of signals. For example, the frame synchronizer 1655 may output a command frame signal 1660 (sometimes deserialized), a frame clock signal 1665, a frame sync signal 1670, or a combination thereof. The frame sync signal 1670 may be a signal that indicates the beginning of a frame. In some cases, the frame sync signal 1670 may be the same signal as the frame clock signal 1665. In other examples, the frame sync signal 1670 may be a different signal than the frame clock 1165.

The interface 1620 may include a command controller 1675. The command controller 1675 may be coupled with the frame synchronizer 1655 such that the command controller 1675 receives the command frame signal 1660 and the frame clock signal 1665. The command controller 1675 may be configured to decode the command frames received using the C/A pin 1635 and identify the various procedures that should be executed based on the command frame. The command controller 1675 may output a control signal 1680 to the array of memory cells 1615 and/or to a data controller 1685.

In some cases, the command controller 1675 may also serve as a latency tracker. In some circumstances there may be a delay between the receipt of a command frame and the communication of data associated with that command frame. In some instances, this delay may be predetermined. For example, after receiving a command frame that includes the instructions to read certain memory cells, the latency tracker may identify the frame during which the memory device 1610 should output the read data using the data signal 1690. In the example of a read operation, during the latency period, the memory device 1610 may issue commands to retrieve the data from the array of memory cells 1615. The latency tracking may be done using the frame clock signal 1665 rather than some other type of signal or clock (e.g., the system clock of the host device 1605). In some cases, the latency tracker may be a separate component from the command controller 1675.

The data controller 1685 may be coupled with the command controller 1675 and a serializer/deserializer 1695 (SerDes) coupled with each of the data pins 1630 and in some cases a SerDes 1695 coupled with the RCLK pin 1645. The data controller 1685 may be configured to receive one or more command signals indicating an operation of the memory device (e.g., a read operation or a write operation) and to control the SerDes 1695 associated with the data pins 1630. For example, the data controller 1685 may determine a read operation is to be performed and may instruct the SerDes 1695 to serialize a data signal 1690 coming from the array of memory cells 1615. In another example, the data controller 1685 may be determine a write operation is to be performed and the may instruct the SerDes 1695 to deserialize a data signal 1690 coming from the host device 1605. The data controller 1685 may control the SerDes 1695 based at least in part on latency information. For example, either the command controller 1675 or the data controller 1685 may delay the issuance of a command to the data pins 1630 until an appropriate frame. The data controller 1685 may be coupled with the frame synchronizer 1655 and may receive the frame sync signal 1670. In some cases, the data controller 1685 may also act as a serializer/deserializer.

Figure 17:
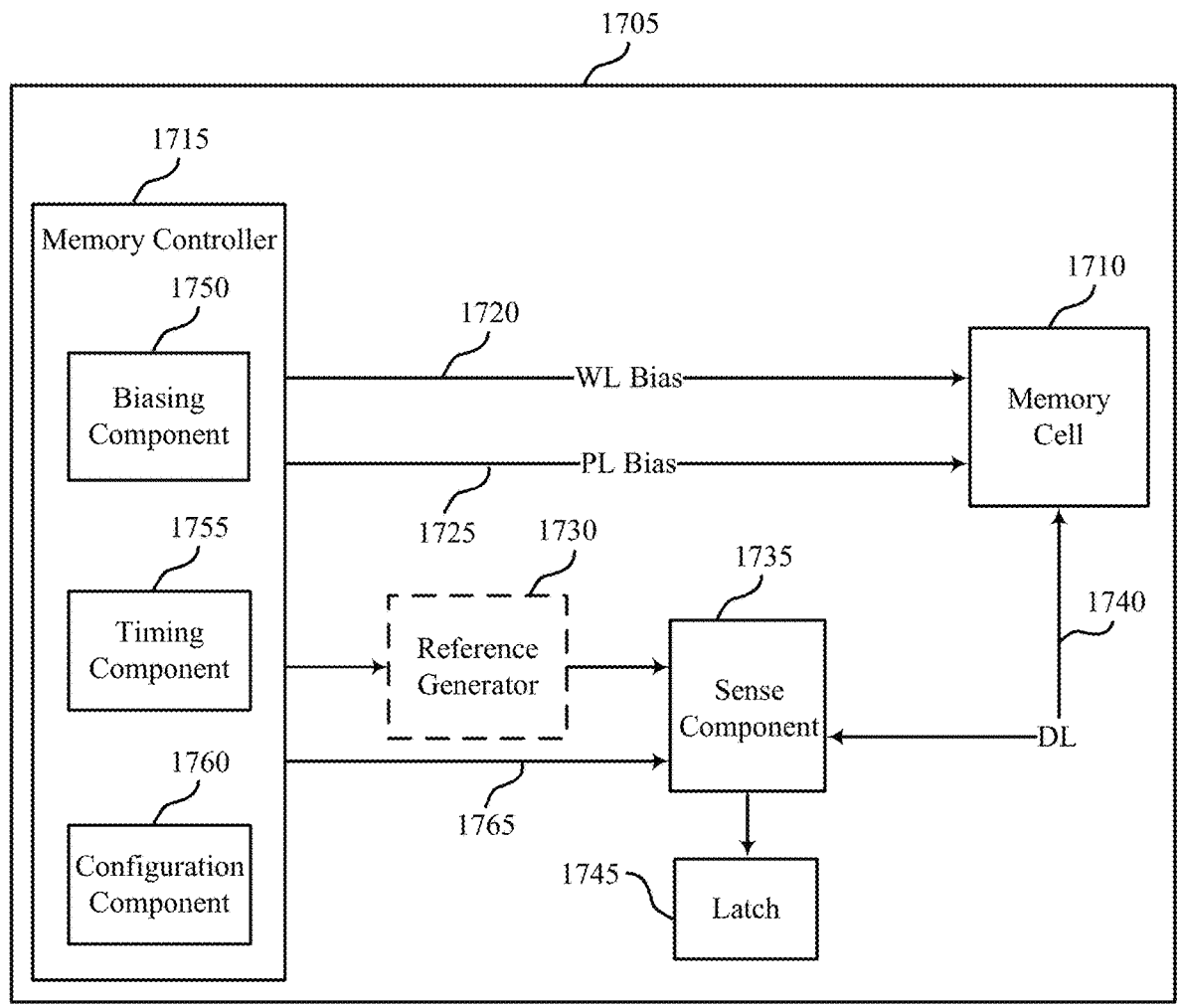
FIGS. 17 through 18 show block diagrams of a device that supports devices and methods for reconfigurable memory architectures in accordance with examples of the present disclosure.

FIG. 17 shows a block diagram 1700 of a memory array 1705 that supports devices and methods for reconfigurable memory architectures in accordance with examples of the present disclosure. Memory array 1705 may be referred to as an electronic memory apparatus, and may be an example of a component of a controller 140 as described herein.

Memory array 1705 may include one or more memory cells 1710, a memory controller 1715, a word line 1720, a plate line 1725, a reference generator 1730, a sense component 1735, a digit line 1740, and a latch 1745. These components may be in electronic communication with each other and may perform one or more of the functions described herein. In some cases, memory controller 1715 may include a biasing component 1750, a timing component 1755, and a configuration component 1760. In some cases, sense component 1735 may serve as the reference generator 1730. In other cases, reference generator 1730 may be optional.

Memory controller 1715 may be in electronic communication with word line 1720, digit line 1740, sense component 1735, and plate line 1725, which may be examples of word line 110, digit line 115, and sense component 125 described with reference to FIG. 1. Memory array 1705 may also include reference generator 1730 and latch 1745. The components of memory array 1705 may be in electronic communication with each other and may perform aspects of the functions described with reference to FIGS. 1 through 16. In some cases, reference generator 1730, sense component 1735, and latch 1745 may be components of memory controller 1715.

In some examples, digit line 1740 is in electronic communication with sense component 1735 and a capacitor of memory cells 1710 (e.g., DRAM or FeRAM). A memory cell 1710 may be writable with a logic state (e.g., a first or second logic state). Word line 1720 may be in electronic communication with memory controller 1715 and a selection component of memory cell 1710. Plate line 1725 may be in electronic communication with memory controller 1715 and a plate of the capacitor of memory cell 1710. Sense component 1735 may be in electronic communication with memory controller 1715, digit line 1740, latch 1745, and a reference line. The reference generator 1730 may be in electronic communication with memory controller 1715. Sense control line 1765 may be in electronic communication with sense component 1735 and memory controller 1715. These components may also be in electronic communication with other components, both inside and outside of memory array 1705, in addition to components not listed above, via other components, connections, or buses.

Memory controller 1715 may be configured to activate the word line 1720, plate line 1725, or digit line 1740 by applying voltages to those various nodes. For example, biasing component 1750 may be configured to apply a voltage to operate the memory cell 1710 to read or write memory cell 1710 as described above. In some cases, memory controller 1715 may include a row decoder, column decoder, or both, as described herein. This may enable the memory controller 1715 to access one or more memory cells 105. Biasing component 1750 may also provide voltage to reference generator 1730 in order to generate a reference signal for sense component 1735. Additionally, biasing component 1750 may provide voltage for the operation of sense component 1735.

In some cases, memory controller 1715 may perform its operations using timing component 1755. For example, timing component 1755 may control the timing of the various word line selections or plate biasing, including timing for switching and voltage application to perform the memory functions, such as reading and writing, discussed herein. In some cases, timing component 1755 may control the operations of biasing component 1750.

The reference generator 1730 may include various components to generate a reference signal for sense component 1735. reference generator 1730 may include circuitry configured to produce a reference signal. In some cases, reference generator 1730 may be implemented using other memory cells. Sense component 1735 may compare a signal from memory cell 1710 (through digit line 1740) with a reference signal from reference generator 1730. Upon determining the logic state, the sense component may then store the output in latch 1745, where it may be used in accordance with the operations of an electronic device that memory array 1705 is a part. Sense component 1735 may include a sense amplifier in electronic communication with the latch and the memory cell.

Configuration component 1760 may be an example of aspects of the configuration component 2015 described with reference to FIG. 20. Configuration component 1760 and/or at least some of its various sub-components may be implemented in hardware, software executed by a processor, firmware, or any combination thereof. If implemented in software executed by a processor, the functions of the configuration component 1760 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure. The configuration component 1760 and/or at least some of its various sub-components may be physically located at various positions, including being distributed such that portions of functions are implemented at different physical locations by one or more physical devices. In some examples, configuration component 1760 and/or at least some of its various sub-components may be a separate and distinct component in accordance with various examples of the present disclosure. In other examples, configuration component 1760 and/or at least some of its various sub-components may be combined with one or more other hardware components, including but not limited to an I/O component, a transceiver, a network server, another computing device, one or more other components described in the present disclosure, or a combination thereof in accordance with various examples of the present disclosure.

Configuration component 1760 may identify a type of an interposer that is configured to couple an array of memory cells of a memory device with a host device and configure a component of the memory device based on the type of the interposer identified, the component being configurable based on the type of the interposer.

Figure 18:
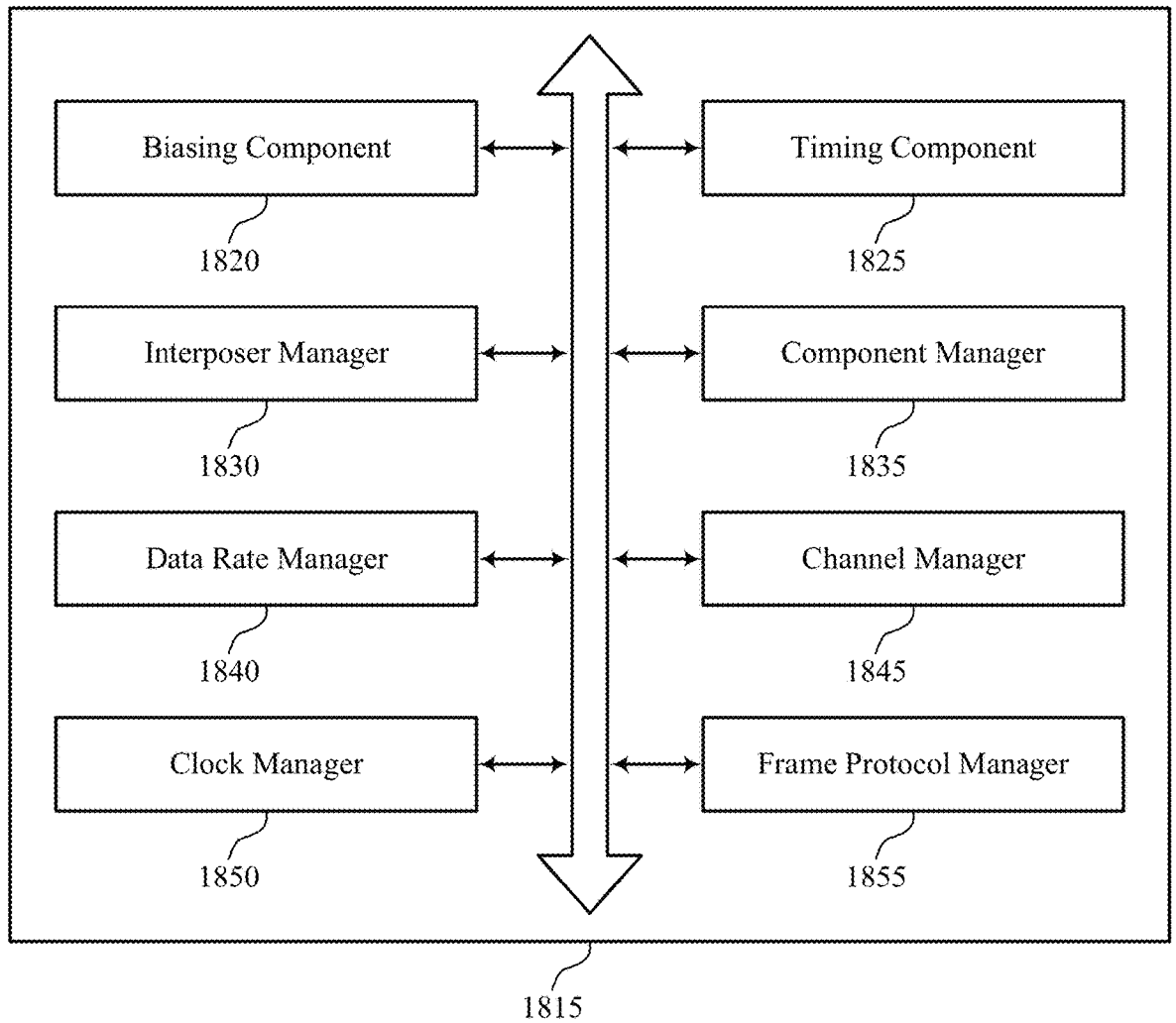

FIG. 18 shows a block diagram 1800 of a configuration component 1815 that supports devices and methods for reconfigurable memory architectures in accordance with examples of the present disclosure. The configuration component 1815 may be an example of aspects of a configuration component 1760 described with reference to FIG. 17. The configuration component 1815 may include biasing component 1820, timing component 1825, interposer manager 1830, component manager 1835, data rate manager 1840, channel manager 1845, clock manager 1850, and frame protocol manager 1855. Each of these components may communicate, directly or indirectly, with one another (e.g., via one or more buses).

Interposer manager 1830 may identify a type of an interposer that is configured to couple an array of memory cells of a memory device with a host device. In some cases, the type of the interposer is identified from a set that includes a high-density interposer and an organic-based interposer.

Component manager 1835 may configure a component of the memory device based on the type of the interposer identified, the component being configurable based on the type of the interposer. The component manager 1835 may identify a default configuration of the memory device associated with a first type of the interposer. The component manager 1835 determine that the type of the interposer is a second type of the interposer different from the first type of the interposer. The component manager 1835 modify a configuration of the component from the default configuration to a new configuration associated with the second type of the interposer.

Data rate manager 1840 may identify a data rate of information communicated using the interposer based on identifying the type of the interposer, where configuring the component is based on identifying the data rate.

Channel manager 1845 may identify a channel width of a data channel that couples a cell region of the array of memory cells with the host device based on identifying the type of the interposer, where configuring the component is based on identifying the channel width, select a pin of the interposer to communicate error correction information based on identifying the type of the interposer, where configuring the component is based on selecting the pin to communicate error correction information, and activate one or more drivers for data pins that are inactive when the type of the interposer is an organic-based interposer based on the type of the interposer being a high-density interposer, where configuring the component is based on activating the one or more drivers.

Clock manager 1850 may identify one or more clock signals based on identifying the type of the interposer, where configuring the component is based on identifying the one or more clock signals, identify a frequency and a phase for each clock signal based on identifying the one or more clock signals, each clock signal having a different phase, where configuring the component is based on identifying the frequency and the phase for each clock signal, and activate one or more drivers for clock pins that are inactive when the type of the interposer is a high-density interposer based on the type of the interposer being an organic-based interposer, where configuring the component is based on activating the one or more drivers.

Frame protocol manager 1855 may identify a first control pin and a second control pin to communicate control information based on the type of the interposer being a high-density interposer and divide a frame of control information into a first frame section to communicate using the first control pin and a second frame section to communicate using the second control pin.

Figure 19:
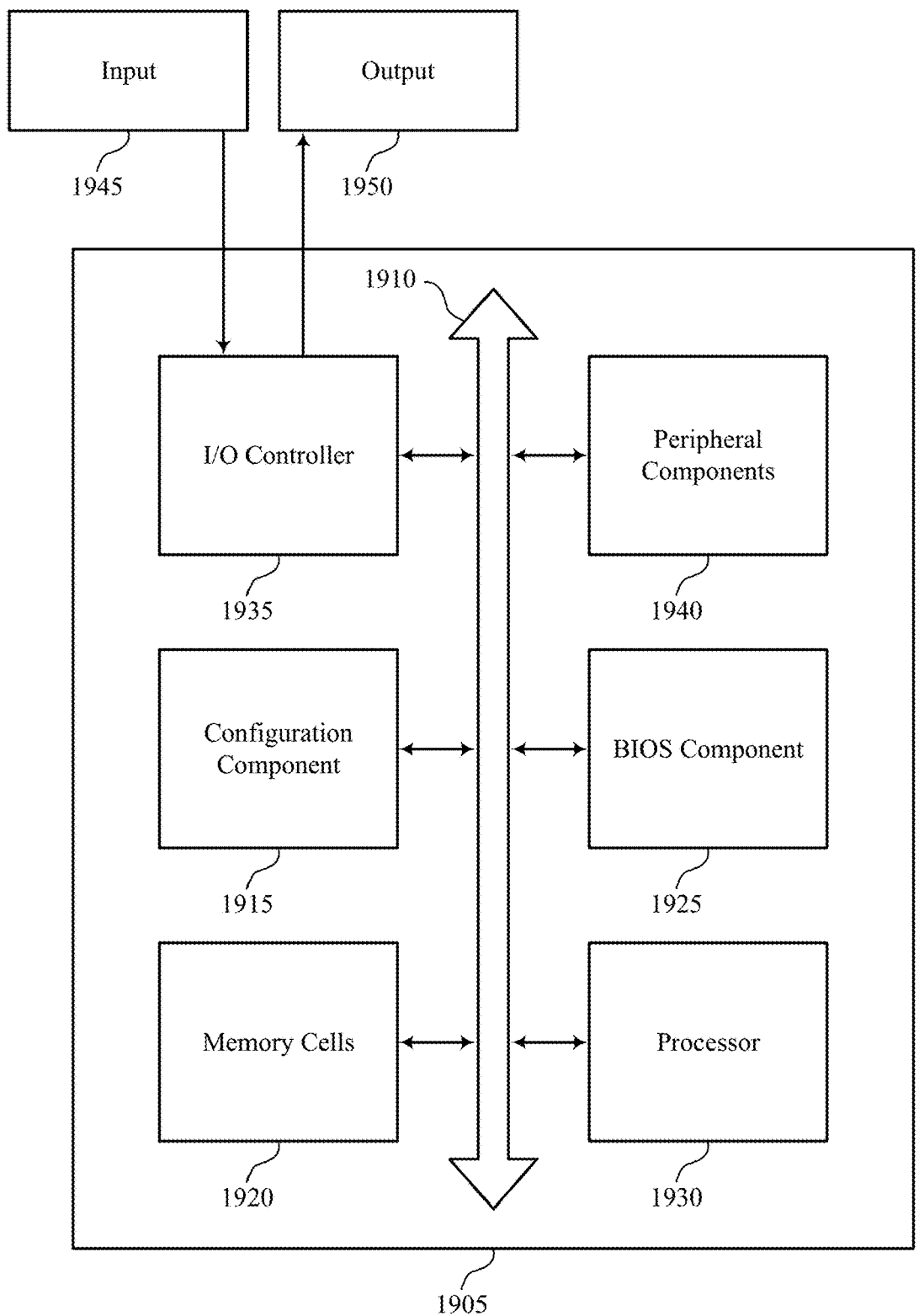
FIG. 19 illustrates a block diagram of a system including a controller that supports devices and methods for reconfigurable memory architectures in accordance with examples of the present disclosure.

FIG. 19 shows a diagram of a system 1900 including a device 1905 that supports devices and methods for reconfigurable memory architectures in accordance with examples of the present disclosure. Device 1905 may be an example of or include the components of controller 140 as described above, e.g., with reference to FIG. 1. Device 1905 may include components for bi-directional voice and data communications including components for transmitting and receiving communications, including configuration component 1915, memory cells 1920, basic input/output system (BIOS) component 1925, processor 1930, I/O controller 1935, and peripheral components 1940. These components may be in electronic communication via one or more buses (e.g., bus 1910). Memory cells 1920 may store information (i.e., in the form of a logical state) as described herein.

BIOS component 1925 be a software component that includes BIOS operated as firmware, which may initialize and run various hardware components. BIOS component 1925 may also manage data flow between a processor and various other components, e.g., peripheral components, input/output control component, etc. BIOS component 1925 may include a program or software stored in read only memory (ROM), flash memory, or any other non-volatile memory.

Processor 1930 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 1930 may be configured to operate a memory array using a memory controller. In other cases, a memory controller may be integrated into processor 1930. Processor 1930 may be configured to execute computer-readable instructions stored in a memory to perform various functions (e.g., functions or tasks supporting devices and methods for reconfigurable memory architectures).

I/O controller 1935 may manage input and output signals for device 1905. I/O controller 1935 may also manage peripherals not integrated into device 1905. In some cases, I/O controller 1935 may represent a physical connection or port to an external peripheral. In some cases, I/O controller 1935 may utilize an operating system such as iOS®, ANDROID®, MS-DOS®, MS-WINDOWS®, OS/2®, UNIX®, LINUX®, or another known operating system. In other cases, I/O controller 1935 may represent or interact with a modem, a keyboard, a mouse, a touchscreen, or a similar device. In some cases, I/O controller 1935 may be implemented as part of a processor. In some cases, a user may interact with device 1905 via I/O controller 1935 or via hardware components controlled by I/O controller 1935.

Peripheral components 1940 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 1945 may represent a device or signal external to device 1905 that provides input to device 1905 or its components. This may include a user interface or an interface with or between other devices. In some cases, input 1945 may be managed by I/O controller 1935, and may interact with device 1905 via a peripheral component 1940.

Output 1950 may also represent a device or signal external to device 1905 configured to receive output from device 1905 or any of its components. Examples of output 1950 may include a display, audio speakers, a printing device, another processor or printed circuit board, etc. In some cases, output 1950 may be a peripheral element that interfaces with device 1905 via peripheral component(s) 1940. In some cases, output 1950 may be managed by I/O controller 1935

The components of device 1905 may include circuitry designed to carry out their functions. This may include various circuit elements, for example, conductive lines, transistors, capacitors, inductors, resistors, amplifiers, or other active or inactive elements, configured to carry out the functions described herein. Device 1905 may be a computer, a server, a laptop computer, a notebook computer, a tablet computer, a mobile phone, a wearable electronic device, a personal electronic device, or the like. Or device 1905 may be a portion or aspect of such a device.

Figure 20:
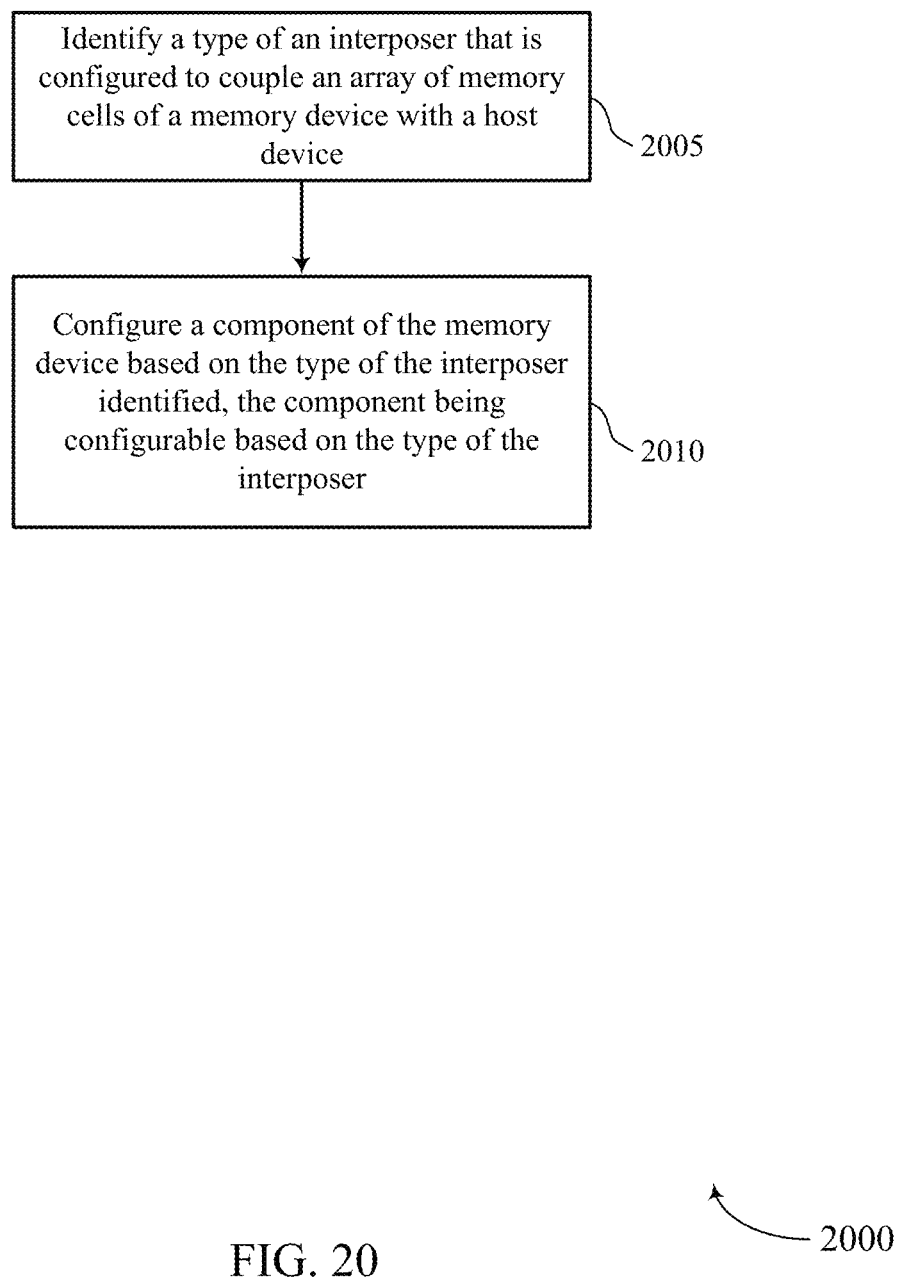
FIG. 20 illustrates a method for devices and methods for reconfigurable memory architectures in accordance with examples of the present disclosure.

FIG. 20 shows a flowchart illustrating a method 2000 for devices and methods for reconfigurable memory architectures in accordance with examples of the present disclosure. The operations of method 2000 may be implemented by a controller 140 or its components as described herein. For example, the operations of method 2000 may be performed by a configuration component as described with reference to FIGS. 17 through 19. In some examples, a controller 140 may execute a set of codes to control the functional elements of the device to perform the functions described below. Additionally or alternatively, the controller 140 may perform aspects of the functions described below using special-purpose hardware.

At 2005 the controller 140 may identify a type of an interposer that is configured to couple an array of memory cells of a memory device with a host device. The operations of 2005 may be performed according to the methods described herein. In certain examples, aspects of the operations of 2005 may be performed by a interposer manager as described with reference to FIGS. 17 through 19.

At 2010 the controller 140 may configure a component of the memory device based at least in part on the type of the interposer identified, the component being configurable based at least in part on the type of the interposer. The operations of 2010 may be performed according to the methods described herein. In certain examples, aspects of the operations of 2010 may be performed by a component manager as described with reference to FIGS. 17 through 19.

In some cases, the method may also include identifying a type of an interposer that is configured to couple an array of memory cells of a memory device with a host device. In some cases, the method may also include dividing a frame of control information into a first frame section to communicate using the first control pin and a second frame section to communicate using the second control pin.

In some cases, the type of the interposer is identified from a set that includes a high-density interposer and an organic-based interposer. In some cases, the method may also include identifying a data rate of information communicated using the interposer based at least in part on identifying the type of the interposer, wherein configuring the component is based at least in part on identifying the data rate.

In some cases, the method may also include identifying a channel width of a data channel that couples a cell region of the array of memory cells with the host device based at least in part on identifying the type of the interposer, wherein configuring the component is based at least in part on identifying the channel width. In some cases, the method may also include identifying one or more clock signals based at least in part on identifying the type of the interposer, wherein configuring the component is based at least in part on identifying the one or more clock signals.

In some cases, the method may also include identifying a frequency and a phase for each clock signal based at least in part on identifying the one or more clock signals, each clock signal having a different phase, wherein configuring the component is based at least in part on identifying the frequency and the phase for each clock signal. In some cases, the method may also include configuring a component of the memory device based at least in part on the type of the interposer identified, the component being configurable based at least in part on the type of the interposer.

In some cases, the method may also include activating one or more drivers for data pins that are inactive when the type of the interposer is an organic-based interposer based at least in part on the type of the interposer being a high-density interposer, wherein configuring the component is based at least in part on activating the one or more drivers. In some cases, the method may also include activating one or more drivers for clock pins that are inactive when the type of the interposer is a high-density interposer based at least in part on the type of the interposer being an organic-based interposer, wherein configuring the component is based at least in part on activating the one or more drivers.

In some cases, the method may also include identifying a default configuration of the memory device associated with a first type of the interposer. In some cases, the method may also include determining that the type of the interposer is a second type of the interposer different from the first type of the interposer. In some cases, the method may also include modifying a configuration of the component from the default configuration to a new configuration associated with the second type of the interposer.

In some cases, the method may also include identifying a first control pin and a second control pin to communicate control information based at least in part on the type of the interposer being a high-density interposer. In some cases, the method may also include selecting a pin of the interposer to communicate error correction information based at least in part on identifying the type of the interposer, wherein configuring the component is based at least in part on selecting the pin to communicate error correction information.

An apparatus for performing the method 2000 is described. The apparatus may include means for identifying a type of an interposer that is configured to couple an array of memory cells of a memory device with a host device and configuring a component of the memory device based on the type of the interposer identified, the component being configurable based on the type of the interposer.

In some examples of the method and the apparatus described herein, the type of the interposer may be identified from a set that includes a high-density interposer and an organic-based interposer.

Some examples of the method and the apparatus described herein may further include operations, features, means, or instructions for identifying a data rate of information communicated using the interposer based on identifying the type of the interposer, where configuring the component may be based on identifying the data rate.

Some examples of the method and the apparatus described herein may further include operations, features, means, or instructions for identifying a channel width of a data channel that couples a cell region of the array of memory cells with the host device based on identifying the type of the interposer, where configuring the component may be based on identifying the channel width.

Some examples of the method and the apparatus described herein may further include operations, features, means, or instructions for identifying one or more clock signals based on identifying the type of the interposer, where configuring the component may be based on identifying the one or more clock signals.

Some examples of the method and the apparatus described herein may further include operations, features, means, or instructions for identifying a frequency and a phase for each clock signal based on identifying the one or more clock signals, each clock signal having a different phase, where configuring the component may be based on identifying the frequency and the phase for each clock signal.

Some examples of the method and the apparatus described herein may further include operations, features, means, or instructions for selecting a pin of the interposer to communicate error correction information based on identifying the type of the interposer, where configuring the component may be based on selecting the pin to communicate error correction information.

Some examples of the method and the apparatus described herein may further include operations, features, means, or instructions for activating one or more drivers for data pins that may be inactive when the type of the interposer may be an organic-based interposer based on the type of the interposer being a high-density interposer, where configuring the component may be based on activating the one or more drivers.

Some examples of the method and the apparatus described herein may further include operations, features, means, or instructions for activating one or more drivers for clock pins that may be inactive when the type of the interposer may be a high-density interposer based on the type of the interposer being an organic-based interposer, where configuring the component may be based on activating the one or more drivers.

Some examples of the method and the apparatus described herein may further include operations, features, means, or instructions for identifying a default configuration of the memory device associated with a first type of the interposer, determining that the type of the interposer may be a second type of the interposer different from the first type of the interposer and modifying a configuration of the component from the default configuration to a new configuration associated with the second type of the interposer.

Some examples of the method and the apparatus described herein may further include operations, features, means, or instructions for identifying a first control pin and a second control pin to communicate control information based on the type of the interposer being a high-density interposer and dividing a frame of control information into a first frame section to communicate using the first control pin and a second frame section to communicate using the second control pin.

It should be noted that the methods described above describe possible implementations, and that the operations and the steps may be rearranged or otherwise modified and that other implementations are possible. Furthermore, examples from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refer to a relationship between components that support electron flow between the components. This may include a direct connection between components or may include intermediate components.

Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

The term "layer" used herein refers to a stratum or sheet of a geometrical structure. Each layer may have three dimensions (e.g., height, width, and depth) and may cover some or all of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array.

The term "isolated" refers to a relationship between components in which electrons are not presently capable of flowing between them; components are isolated from each other if there is an open circuit between them. For example, two components physically connected by a switch may be isolated from each other when the switch is open.

The devices discussed herein, including memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks, components, and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
    a substrate configured to couple an array of memory cells with a host device, the substrate comprising a plurality of channels, wherein a component of the array of memory cells is configurable based at least in part on a type of the substrate;
    an input/output (I/O) channel extending in a first direction away from an edge of the array of memory cells, the I/O channel traversing at least a portion of the array of memory cells and comprising a plurality of power pins and a plurality of ground pins coupled with the array of memory cells; and
    a data channel extending in the first direction away from the edge of the array of memory cells, wherein the data channel is parallel to the I/O channel and configured to couple memory cells of the array of memory cells with the host device, and wherein at least a portion of the data channel comprises at least one channel of the plurality of channels.

2. The apparatus of claim 1, further comprising:
    a second I/O channel extending in the first direction from the edge of the array of memory cells.

3. The apparatus of claim 1, wherein:
    the substrate comprises a high-density substrate or an organic-based substrate;
    the I/O channel is coupled with a plurality of cell regions of the array of memory cells; and
    the data channel is coupled with a single cell region of the array of memory cells.

4. The apparatus of claim 1, wherein the data channel comprises eight data pins, a first clock pin configured to communicate a first clock signal having a clock frequency and a first phase, and a second clock pin configured to communicate a second clock signal having the clock frequency and a second phase different from the first phase.

5. The apparatus of claim 1, further comprising:
    a data channel pair that includes a first plurality of data pins coupled with a first cell region, a second plurality of data pins coupled with a second cell region, and a set of clock pins coupled with the first cell region and the second cell region, wherein the first plurality of data pins corresponds to the data channel.

6. The apparatus of claim 1, wherein the array of memory cells includes a cell region having a plurality of banks of memory cells, the data channel being coupled with the cell region and configured to access memory cells of the cell region.

7. A method, comprising:
    identifying a type of a substrate that is configured to couple an array of memory cells of a memory device with a host device; and
    configuring a component of the memory device based at least in part on the type of the substrate identified.

8. The method of claim 7, wherein:
    the type of the substrate comprises a high-density substrate or an organic-based substrate; and
    the component of the memory device is configurable based at least in part on the type of the substrate.

9. The method of claim 7, further comprising:
    configuring the component of the memory device based at least in part on a rate of information communicated using the substrate.

10. The method of claim 7, further comprising:
    configuring the component of the memory device based at least in part on a channel width of a data channel that couples a region of the array of memory cells with the host device.

11. The method of claim 7, further comprising:
    configuring the component of the memory device based at least in part on one or more clock cycles.

12. The method of claim 7, further comprising:
    configuring the component of the memory device based at least in part on selecting a pin of the substrate to communicate error correction information to the host device.

13. The method of claim 7, further comprising:
    modifying a configuration of the component of the memory device from a first configuration to a second configuration based at least in part on determining that the substrate is a second type of substrate different than a first type of substrate.

14. An apparatus, comprising:
    an array of memory cells;
    a substrate configured to couple the array of memory cells with a host device;
    a component of the array of memory cells that is configurable; and
    a controller configured to:
    identify a type of the substrate; and
    configure the component based at least in part on the type of the substrate identified.

15. The apparatus of claim 14, wherein the type of the substrate comprises a high-density substrate or an organic-based substrate.

16. The apparatus of claim 14, wherein the component comprises a data channel, and wherein the controller is configured to:
    configure the data channel based at least in part on a channel width of the data channel, wherein the data channel is associated with a region of memory cells of the array of memory cells.

17. The apparatus of claim 14, further comprising a driver, wherein the controller is configured to:
    transmit data, at a first rate, across a data pin using the driver based at least in part on the type of the substrate.

18. The apparatus of claim 14, wherein the controller is configured to:
  transmit, to the host device, error correction information using a pin that is selected based at least in part on the type of the substrate.

19. The apparatus of claim 14, wherein the component comprises one or more clock pins, wherein the controller is configured to:
  identify a frequency and a phase of one or more clock signals based at least in part on the type of the substrate.

20. The apparatus of claim 14, wherein the controller is configured to:
  determine that the substrate is a second type of substrate different than a first type of substrate; and
  modify a configuration of the component from a first configuration to a second configuration based at least in part on determining that the substrate is the second type of substrate.

\* \* \* \* \*